US010712601B2

(12) United States Patent
Oh et al.

(10) Patent No.: US 10,712,601 B2
(45) Date of Patent: Jul. 14, 2020

(54) DISPLAY DEVICE COMPRISING A MODULE CASE HAVING A THROUGH-HOLE AND AN OUTER CASE HAVING AN INTERNAL SPACE WITH A FIRST CLOSED PASSAGE

(71) Applicant: LG ELECTRONICS INC., Seoul (KR)

(72) Inventors: Honglyeol Oh, Seoul (KR); Jinwook Kim, Seoul (KR); Hyeuk Chang, Seoul (KR); Joongnyon Kim, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 308 days.

(21) Appl. No.: 15/916,166

(22) Filed: Mar. 8, 2018

(65) Prior Publication Data

US 2018/0259806 A1 Sep. 13, 2018

(30) Foreign Application Priority Data

Mar. 13, 2017 (KR) .................. 10-2017-0031417

(51) Int. Cl.
*G02F 1/1333* (2006.01)
*G02F 1/1335* (2006.01)
(Continued)

(52) U.S. Cl.
CPC ...... *G02F 1/133385* (2013.01); *G02F 1/1335* (2013.01); *G06F 1/1601* (2013.01);
(Continued)

(58) Field of Classification Search
CPC ... G02F 1/133385; G02F 2001/133322; G02F 2201/36; G02F 1/1335; H05K 7/20972
See application file for complete search history.

(56) References Cited

U.S. PATENT DOCUMENTS

2010/0296245 A1* 11/2010 Dunn ................. H05K 7/20972
361/695
2011/0013114 A1* 1/2011 Dunn ................ G02F 1/133385
349/61
(Continued)

FOREIGN PATENT DOCUMENTS

| JP | 2004053749 A | * | 2/2004 | ......... G02F 1/33308 |
| JP | 2014112181 A | * | 6/2014 | ......... G02F 1/33308 |
| KR | 1020130117251 | | 10/2013 | |

OTHER PUBLICATIONS

PCT International Application No. PCT/KR2018/002200, Notification of Transmittal of the International Search Report and the Written Opinion of the International Searching Authority, or Declaration dated May 29, 2018, 22 pages.

*Primary Examiner* — Paul C Lee
(74) *Attorney, Agent, or Firm* — Lee, Hong, Degerman, Kang & Waimey

(57) ABSTRACT

There is disclosed a display device comprising a light source unit, an optical sheet spaced a preset distance apart from a front of the light unit, a display panel spaced a preset distance apart from a front surface of the optical sheet, a module case configured to form at least one of a first space between the display panel and the optical sheet, a second space between the optical sheet and the light source unit and a third space in a rear surface of the light source unit, a through-hole formed in the module case and at least one of the first through third spaces, and an outer case configured to form an internal space partitioned off from an external space and a first closed passage located in the internal space by mounted the module case, wherein the first passage is located in the first closed passage.

13 Claims, 25 Drawing Sheets

(51) Int. Cl.
*G06F 1/16* (2006.01)
*G06F 1/20* (2006.01)
*H05K 7/20* (2006.01)

(52) U.S. Cl.
CPC ........... *G06F 1/20* (2013.01); *H05K 7/20972* (2013.01); *G02F 2001/133317* (2013.01); *G02F 2001/133322* (2013.01); *G02F 2201/36* (2013.01)

(56) References Cited

U.S. PATENT DOCUMENTS

| | | | |
|---|---|---|---|
| 2012/0020114 A1* | 1/2012 | Miyamoto | G02B 6/0085 362/612 |
| 2014/0055707 A1* | 2/2014 | Yu | G02F 1/133308 349/58 |
| 2015/0195959 A1* | 7/2015 | Hubbard | G02F 1/133308 361/692 |
| 2015/0253612 A1* | 9/2015 | Hasegawa | G02F 1/133308 349/58 |
| 2016/0041423 A1 | 2/2016 | Dunn | |
| 2016/0198589 A1* | 7/2016 | Kang | G02F 1/133385 361/692 |
| 2017/0059938 A1 | 3/2017 | Brown et al. | |

* cited by examiner

DISPLAY DEVICE COMPRISING A MODULE CASE HAVING A THROUGH-HOLE AND AN OUTER CASE HAVING AN INTERNAL SPACE WITH A FIRST CLOSED PASSAGE

CROSS-REFERENCE TO RELATED APPLICATIONS

Pursuant to 35 U.S.C. § 119(a), this application claims the benefit of earlier filing date and right of priority to Korean Patent Application No. 10-2017-0031417, filed on Mar. 13, 2017, the contents of which are all hereby incorporated by reference herein in its entirety.

BACKGROUND OF THE DISCLOSURE

Field of the Disclosure

Embodiments of the present disclosure relate to a display device which considers a heat radiation structure.

Background of the Disclosure

A display device means one mechanical unit which defines a display module mounted therein.

Such a display device usually has a large-inch display and is located in an external surface of which the temperature is very different from ambient temperatures and which has many foreign substances such as dust.

Under such environmental conditions, the display device has a relatively high brightness to secure a sufficient outdoor visibility. The display device is likely to be neglected under a high outdoor temperature. Accordingly, it is necessary to provide a structure which is capable of dissipate the heat generated by the drive of the display device.

The heat radiation or dissipation is realized in the display device in diverse ways. Main examples of the heat radiation include an air-cooling method and a water-cooling method. Also, there is a further contact method which uses a heat pipe.

Such the heat radiation cooling methods may be used exclusively. As occasion demands, two or more methods may be used combinedly.

The air cooling method out of the methods mentioned above may include a direct cooling method configured to filter dust or inflow foreign substances, using a filter, while direct inflow of external air is allowed and an indirect cooling method configured to generate heat exchange between external air and internal air of the device, using a heat exchanger, while external air and internal air are basically shut off from each other.

Considering the characteristic of the display device exposed to dust and foreign substances, the indirect cooling method can be a good choice. However, external air is not directly heat exchanged with a heat generation region in the indirect cooling method and heat radiation efficiency may be a major issue in the indirect cooling method.

Especially, heat is likely to be generated in some regions of the display device such as a front panel of a display module, in a rear backlight unit of the display module and other electronic components. If only one circulation structure is provided, the internal air which has failed heat exchange might pass other heat generation regions as it is only to fail sufficient heat exchange.

Accordingly, there are demands for an air circulation method via an internal or external structure of the display device or the specification of the air circulation structure for effective heat radiation.

Moreover, the display device is configured to have the display module mounted therein. The display module means one part including a display panel, an optical sheet and a light source unit and mounted in the display device as one assembly.

The heat generated in the display module including the components mentioned above represents a significant portion of the overall heat generated in the display device. Accordingly, it is necessary to consider a heat radiation structure for mainly radiating the heat generated in the display module.

SUMMARY OF THE DISCLOSURE

Accordingly, an object of the present invention is to address the above-noted and other problems.

An object of the present disclosure is to solve the disadvantage of the heat radiation in the display device mentioned above.

Embodiments of the present disclosure may provide a display device comprising a light source unit; an optical sheet spaced a preset distance apart from a front of the light unit; a display panel spaced a preset distance apart from a front surface of the optical sheet; a module case configured to form at least one of a first space between the display panel and the optical sheet, a second space between the optical sheet and the light source unit and a third space having a rear surface of the light source unit exposed thereto; a through-hole formed in the module case and at least one of the first space, the second space and third spaces; and an outer case configured to form an internal space partitioned off from an external space and a first closed passage located in the internal space by mounted the module case, wherein the first passage is located in the first closed passage.

The first passage may be formed in one of the first, second and third spaces.

The first passage may be formed throughout the first space and the second space.

The display device may further comprise an inner case configured to form a second closed passage partitioned off from the first closed passage and surrounded by the first closed passage with respect to one cross section.

The outer case may comprise a first open hole partitioned off from the internal space and located in the external space, and the first open hole may be provided between the first closed passage and the second closed passage.

The display device may further comprise a partition bracket configured to form a second closed passage partitioned off from the first closed passage and configured to directly exchange heat with the external space.

The internal space may be partitioned off into a front surface space including the display module and a rear surface space partitioned off from the front surface space, and the first closed passage may be provided in the front surface space and the second closed passage is provided in the rear surface space.

The outer case may comprise a second open hole partitioned off from the internal space and located in the external space, and the second open hole may be surrounded by the second closed passage.

The module case may comprise a third open hole partitioned off from the internal space and located in the external space, and the third open hole may pass through the third space.

The outer case may comprise a fourth hole partitioned off from the internal space and located in the external space, and one region of the fourth open hole may be in contact with the third open hole and the other region is in contact with the first closed passage.

The outer case may comprise a fifth open hole partitioned off from the internal space and located in the external space, and an inlet and an outlet of the fifth open hole may be formed in one surface of the outer case, and wherein the display device may further comprise a division bracket configured to distinguish the inlet and the outlet of the fifth open hole from each other.

The outer case may comprise a sixth open hole partitioned off from the internal space and located in the external space, and the sixth open hole may comprise a first heat radiation portion provided in a rear surface of the outer case; a second heat radiation portion spaced a preset distance apart from the first heat radiation portion; and a connecting portion connecting the first and second heat radiation portions with each other in one region.

A front surface of the display panel may be coupled to a front surface of the outer case.

The mobile terminal in accordance with the present disclosure has following effects.

The mobile terminal according to at least one embodiment mentioned above is capable of enhancing heat radiation efficiency.

Furthermore, the mobile terminal according to at least one embodiment is capable of emitting the heat generated in the display module effectively.

Still further, the mobile terminal according to at least one embodiment is able to making the direction of natural convection be equal to the direction of forcible convection.

Still further, the visibility of the inlet and the outlet of the open hole may be minimized.

Further scope of applicability of the present invention will become apparent from the detailed description given hereinafter. However, it should be understood that the detailed description and specific examples, while indicating preferred embodiments of the invention, are given by illustration only, since various changes and modifications within the spirit and scope of the invention will become apparent to those skilled in the art from this detailed description.

BRIEF DESCRIPTION OF THE DRAWINGS

The present invention will become more fully understood from the detailed description given herein below and the accompanying drawings, which are given by illustration only, and thus are not limitative of the present invention, and wherein.

DESCRIPTION OF SPECIFIC EMBODIMENTS

Description will now be given in detail according to exemplary embodiments disclosed herein, with reference to the accompanying drawings. For the sake of brief description with reference to the drawings, the same or equivalent components may be provided with the same reference numbers, and description thereof will not be repeated. In general, a suffix such as "module" and "unit" may be used to refer to elements or components. Use of such a suffix herein is merely intended to facilitate description of the specification, and the suffix itself is not intended to give any special meaning or function. In the present disclosure, that which is well-known to one of ordinary skill in the relevant art has generally been omitted for the sake of brevity. The accompanying drawings are used to help easily understand various technical features and it should be understood that the embodiments presented herein are not limited by the accompanying drawings. As such, the present disclosure should be construed to extend to any alterations, equivalents and substitutes in addition to those which are particularly set out in the accompanying drawings.

It will be understood that although the terms first, second, etc. may be used herein to describe various elements, these elements should not be limited by these terms. These terms are generally only used to distinguish one element from another.

It will be understood that when an element is referred to as being "connected with" another element, the element can be directly connected with the other element or intervening elements may also be present. In contrast, when an element is referred to as being "directly connected with" another element, there are no intervening elements present.

A singular representation may include a plural representation unless it represents a definitely different meaning from the context. Terms such as "include" or "has" are used herein and should be understood that they are intended to indicate an existence of several components, functions or steps, disclosed in the specification, and it is also understood that greater or fewer components, functions, or steps may likewise be utilized.

A display device which is described hereinafter commonly means all type of devices including an output unit for outputting an image. Main examples of the display device include a digital TV, an analog TV, a desktop computer, a digital signage and the like.

Moreover, the examples of the display device may further include a middle-sized or large-sized output device such as a signage which is installed in an outdoor housing.

There is an outdoor billboard as one example of the output device.

As mentioned above, exemplary embodiments of the present disclosure are invented and developed with a focus on the display device such as the signage installed in such an outdoor housing.

Figure 1:
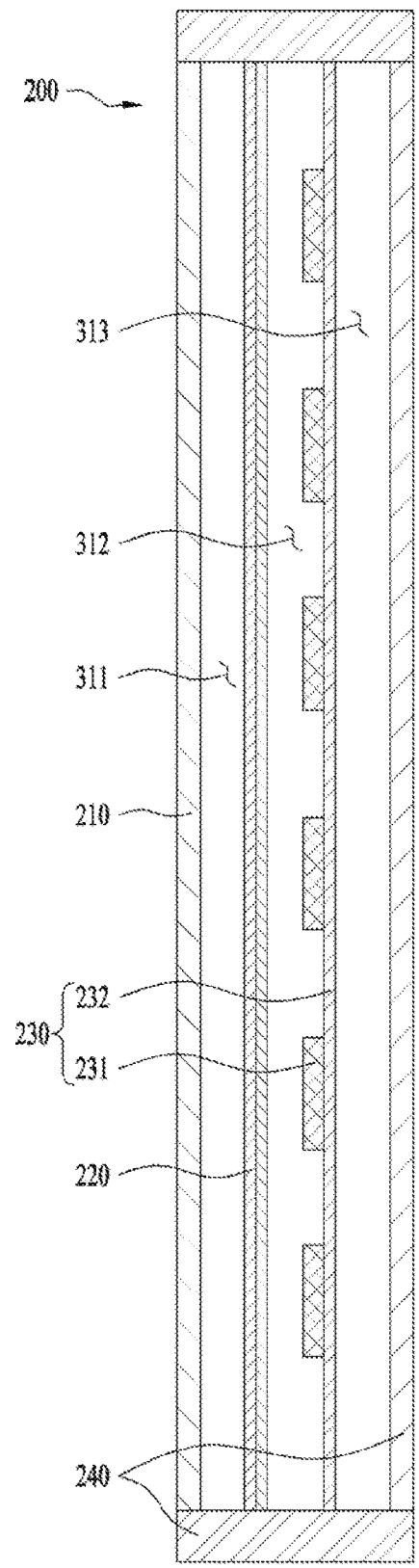
FIG. 1 is a block diagram to describe one example of a display module in accordance with the present disclosure.

FIG. 1 illustrates one example of a display module 200 in accordance with the present disclosure.

The display module 200 applicable to exemplary embodiments of the present disclosure is a liquid crystal display (LCD). However, exemplary embodiments may be applied to an organic light emitting diode (OLED) display module 200 within the scope of the present disclosure.

The display module 200 includes a display panel 210 for directly outputting an image; and a backlight unit disposed behind a rear surface of the display panel to emit light; and a module case 240 for physically fixing the other components.

The display panel 210 is configured to output an image directly. The display panel 210 provided in the LCD display module 200 may include a polarizing plate; a color filter (C/F) glass; a liquid crystal; and a thin film transistor (TFT).

The backlight unit is provided toward the rear surface of the display panel 210 and provides light to the display panel 210.

The backlight unit mainly includes an optical sheet 220 and a light source unit 230. The light source unit 230 may include at least one light source 231 and a substrate 232. As occasion demands, it may further include a light guide plate.

The light source unit 230 provides light by illuminating the light source 231. The light source unit 230 may be categorized into an edge type which is arranged in a predetermined region of the display panel 210 and a direct type which is an overall region of the rear surface of the display panel 210 based on the arrangement of the light sources 231.

The one or more light sources 231 may be provided in the substrate 232 and provided with electric power and electrical signals. In the edge type light source unit, the substrate 232 having the light sources 231 mounted therein is disposed in a predetermined portion of the display panel 210. In the direct type, the substrate 232 having the light sources 231 is disposed in an overall region of the rear surface of the display panel 210.

The edge type light source unit may further include a light guide plate for dispersing light; and a reflector and the like for minimizing the loss of the light transmitted after reflected on a rear surface of the light guide plate, together with the light source 230.

A bottom cover is provided in a rear surface of the light source unit 230 and configured to protect the display panel 210 and the light source unit 230 and secure the rigidity of the display module 200. The bottom cover is also employed to dissipate the heat transmitted from the light source unit 230 and the display panel 210. To satisfy the functions, the bottom cover may include a metallic material.

The optical sheet 220 is configured to transmit the light emitted from the light source unit 230 to the display panel 210 uniformly and minimize the loss of the light. For example, the optical sheet 220 may include a reflector or diffuser.

The optical sheet 220 may be spaced a preset distance in front of the light source unit.

The components mentioned above are fixedly mounted in the module case 240 and defines a predetermined exterior appearance of the display module 200.

The module case 240 may be formed to surround front, lateral and rear surfaces of the display module 200. The front surface of the module case 240 has an opening to expose the front surface of the display panel 210 outside. As occasion occurs, the opening may be covered by a window.

The display panel 210, the optical sheet 220 and the light source unit 230 mounted in the module case 240 may be spaced a preset distance apart from each other and form a gap or space there between, so as to form a passage of air for performing a heat radiation function which will be described later.

A first space 311 is formed between the display panel 210 and the optical sheet 220. A second space 312 is formed between the optical sheet 220 and the light source unit 230. A third space 313 is formed such that a rear surface of the light source unit 230 is exposed to the third space 313. In other words, the third space 313 means a space defined between the light source unit 230 and the rear surface of the module case 240.

The first through third spaces 311 to 313 are not necessarily provided. As occasion occurs, only one or two spaces may be formed.

Unless specifically noted, the module case 240 may partition the components mounted in the display module 200 off from the outside, in other words, form an independent space from an external space 10 of the display module 200. In this instance, it is not necessary to prevent other foreign substances such as air from introduced into the module case. That means that air cannot form sufficient flow and enter the display case, without a through hole 241 which will be described later.

Figure 2:
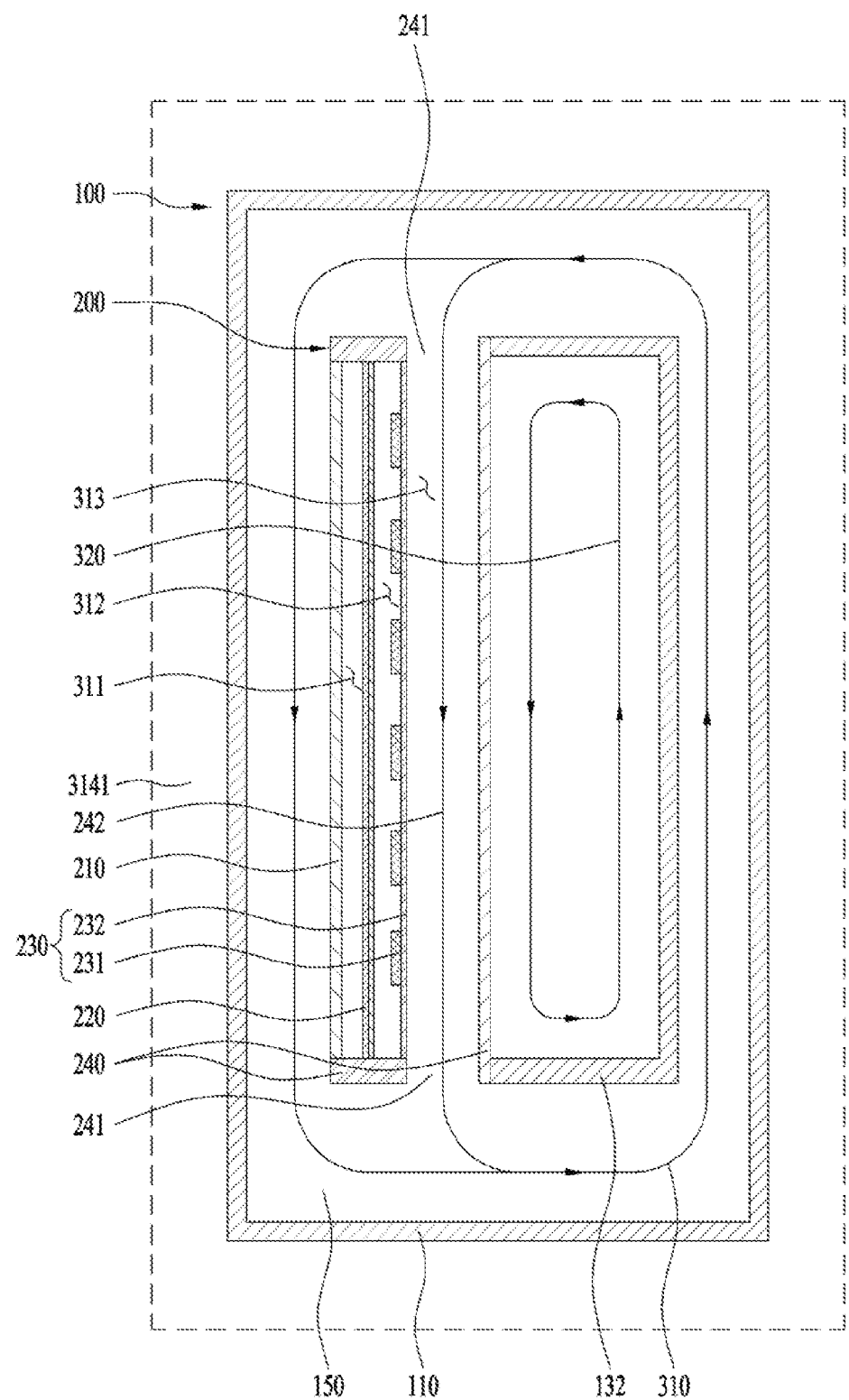
FIG. 2 is a sectional conceptual diagram of one example of the display device.

FIG. 2 is a sectional conceptual diagram of one example of the display module.

The display module 200 has a through hole 241 to form a first passage 242 for external air of the display module 200. The through hole 241 may be formed in the module case 240.

The through hole 241 may be provided in at least two spots to form an inlet and an outlet of the first passage 242. The through hole 241 may be provided at least two spots of the module case 240 which are predetermined to lead air into the module case 240 there through. Especially, in case the through holes are provided in one lateral surface and the other lateral surface of the module case 240, it is possible to circulate air in most regions of the internal space 150 defined in the module case 240.

Figure 3:
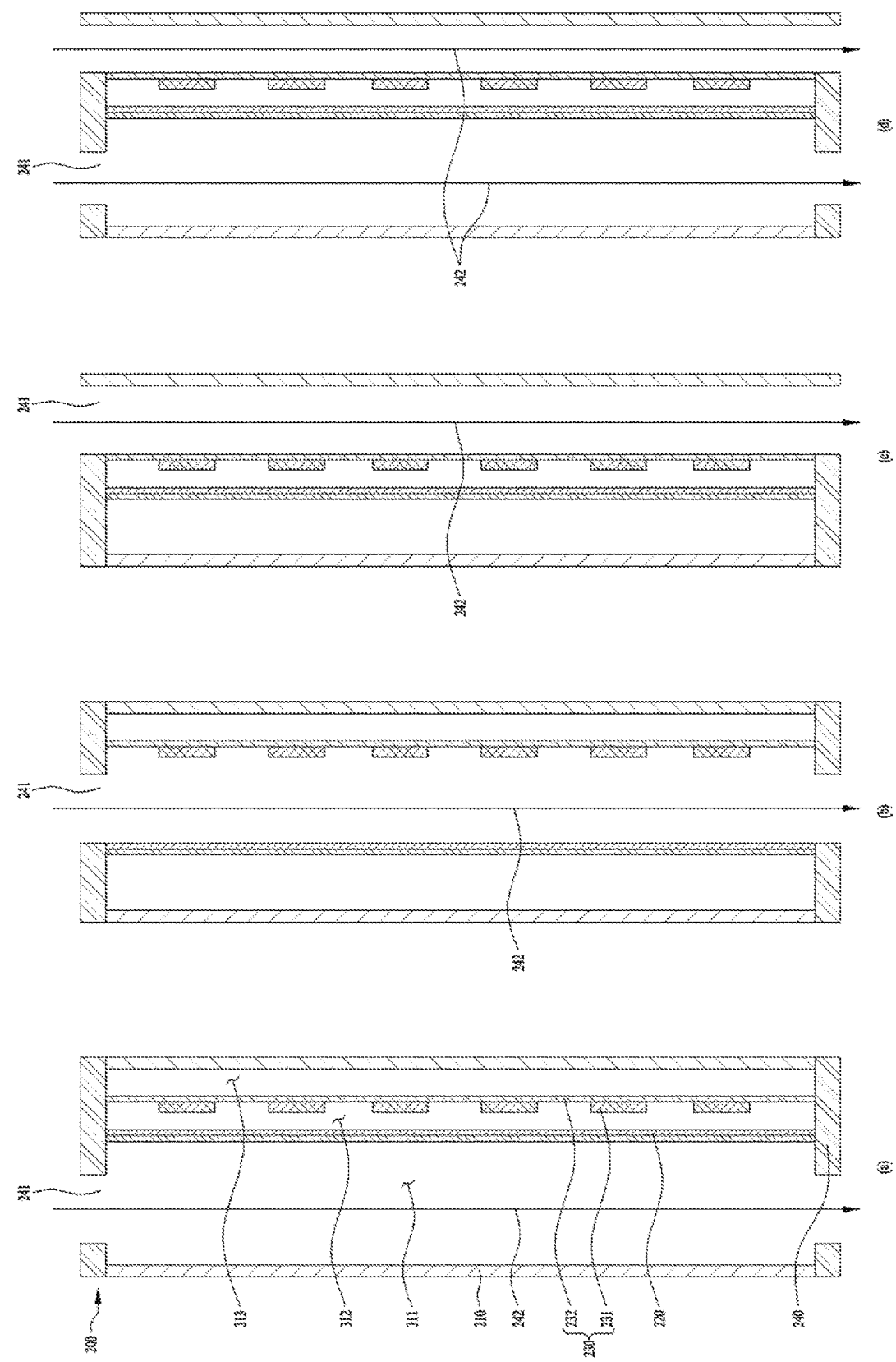
FIG. 3 is a diagram illustrating several examples of the display module in accordance with the present disclosure.

FIG. 3 is a diagram illustrating several examples of the display module 200 in accordance with the present disclosure.

All of the sectional conceptual diagrams which will be described hereinafter are provided only to describe the relation between each spaces, not to describe a view of one cross section.

The through hole 241 may penetrate at least one of the first, second and third spaces 311, 312 and 313.

When the through hole 241 penetrates one of the first, second and third spaces 311, 312 and 313, the other two spaces are closed airtight.

When the through hole 241 penetrates the two of the spaces, the other one space is closed airtight. When the through hole 241 is formed in neighboring two spaces, the inlet 1601 and the outlet 16 of the through hole 241 may be formed in the neighboring spaces, respectively.

In case the first passage is formed in the first space 311, the rear surface of the display panel 210 and the front surface of the optical sheet 220 may be exposed to the first passage 242.

In case the first passage 242 is formed in the second space 312, the rear surface of the optical sheet 220 and the front surface of the light source unit 230 may be exposed to the first passage 242.

In case the first passage 242 is formed in the third space 313, the rear surface of the light source unit 230 may be exposed to the first passage 242.

It is preferred that the first passage 242 is formed in one of the display module components where relatively much heat is generated.

The specific location and appearance of the through hole 242 will be described later.

Referring to FIG. 2 again, the module case 240 may be mounted in an outer case 110 and the outer case 110 may define an exterior of the display device 100.

The outer case 110 has an internal space 150 partitioned off from the external space 10 of the display device 100. Not exchange of media such as air but exchange of heat is performed between the external space 10 and the internal space 150 of the outer case 110.

A first closed passage 310 is formed in the internal space 150 of the outer case 110 and has the first passage 242 formed by the display module 200.

More specifically, while flowing along the first closed passage 310 having the first passage 242, air is provided with the heat generated in the display device 100 and radiates the heat to the external space 10.

The air of the first closed passage 310 is able to be circulated not only in the internal space 150 of the display device 100 but also the internal space 150 of the display module 200, so that the heat generated in the display module 200 can be directly circulated to enhance heat radiation efficiency.

The first passage 242 of the display module 200 may be formed in diverse shapes and then applied to the external case 110 formed in diverse shapes.

Key ones of the diverse shapes will be described hereinafter.

FIG. 2 is a sectional conceptual diagram of one example of the display device 100.

The inner case 132 is coupled to the rear surface of the display module 200 and forms a second closed passage 320 which is partitioned off from the first closed passage 310. The description that the second closed passage 230 is partitioned off from the first closed passage 310 means a state where heat is able to be exchanged between the passages, not air.

As occasion occurs, an internal fan 141 may be provided in the first closed passage 310 or the second closed passage 320 to form air flow. The internal fan 141 forcibly forms convection to enhance the heat radiation efficiency.

The inner case 132 may expose the rear surface of the display module 200, in other words, the rear surface of the module case 240 to the second closed passage 320.

The air of the first closed passage 310 may pass through the space 3141 formed between the display module 200 and the display device 100 and then the third space 313 mentioned above via the through hole 241.

The first closed passage 310 is formed to surround the second closed passage 320 by the inner case 132.

When the first closed passage is formed to surround the second closed passage 320, direct heat exchange is performed between the first closed passage 310 and the external space 10 and the first closed passage 310 has a relatively wider heat radiation area than the second closed passage 320. Accordingly, the heat radiation efficiency of the first closed passage 310 is higher than that of the second closed passage 320.

FIG. 2 shows that the first passage 242 is formed in the third space 313. Alternatively, it may be formed in the first space 311 or the second space 312.

Figure 4:
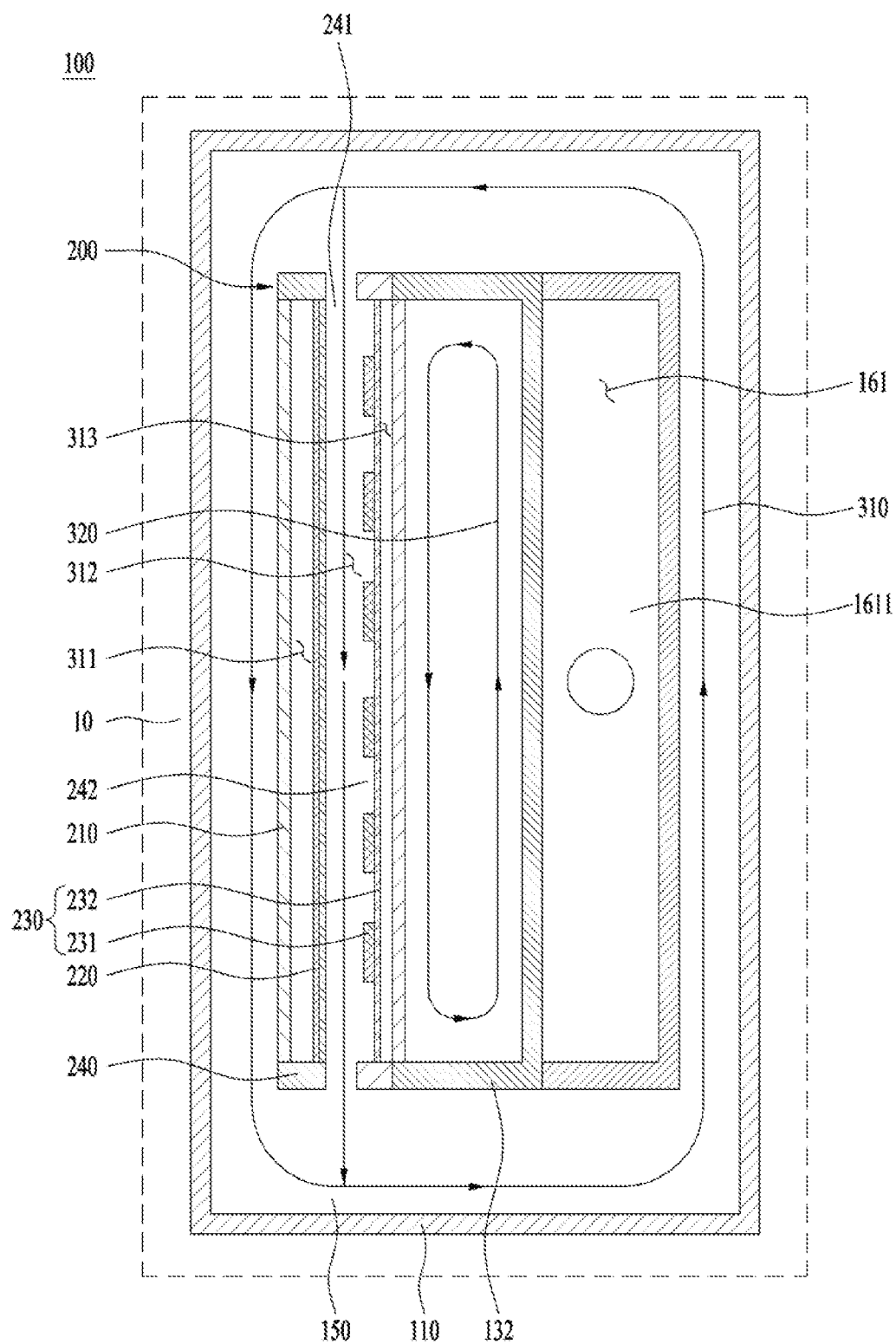
FIG. 4 is a sectional conceptual diagram illustrating one example of a display device in accordance with the present disclosure.

FIG. 4 is a sectional conceptual diagram illustrating one example of a display device 100 in accordance with the present disclosure.

According to the embodiment shown in FIG. 2, only the air of the second closed passage 320 may directly exchange heat with the external space 10 of the display device 100 through the outer case 110. Accordingly, the heat exchange of the second closed passage 320 has to be indirectly performed with the external space 10 via the first closed passage 310. Such indirect heat exchange allows relatively less heat transmission, as the temperature difference between the second closed passage 320 and the first closed passage 310 is smaller than the temperature difference between the second closed passage 320 and the external space 10. In addition, the heat of the second closed passage 320 is transmitted to the first closed passage 310 and the first closed passage 310 radiates the heat to the external space 10, which becomes the main cause of unnecessary temperature rise in the first closed passage 310.

To solve the inefficiency of such the heat radiation structure, the outer case 110 may include a first open hole 161 which forms a first outer passage 1611.

The first open hole 161 is partitioned off from the internal space 150 and located in the external space 10. Accordingly, the media of the internal space 150 is shut off and provided with only heat to perform the heat radiation of the display device 100.

The first open hole 161 may be provided between the first closed passage 310 and the second closed passage 320. In other words, some heat of the first closed passage 310 and some heat of the second closed passage 320 are transmitted to the first outer passage 1611 passing through the first open hole 161 to perform the heat radiation of the display device 100.

Even in this instance, the first passage 242 may be formed in at least one of the first, second and third spaces 311, 312 and 313.

The third space 313 is basically provided between the rear surface of the light source unit 230 and a rear plate of the display module 200. As occasion occurs, the third space may be omitted. In other words, the rear surface of the light source unit 230 may be in contact with the rear plate and not auxiliary space is formed.

FIG. 4 illustrates that the first passage 242 is formed in the second space 312.

In this instance, the air circulating the first closed passage 310 may be provided with some heat of the display module 200 and circulated, while passing through the rear surface of the optical sheet 220 and the front surface of the light source unit 230.

The air of the first closed passage 310 which is intensively provided with heat may transmit the heat to the external space 10 of the display device and the first outer passage 1611 of the first open hole 161 simultaneously.

FIGS. 5 through 9 illustrate one example of the display device 100 which realizes the embodiment of FIG. 4.

For description sake, FIGS. 5 through 9 are referred to.

Figure 5:
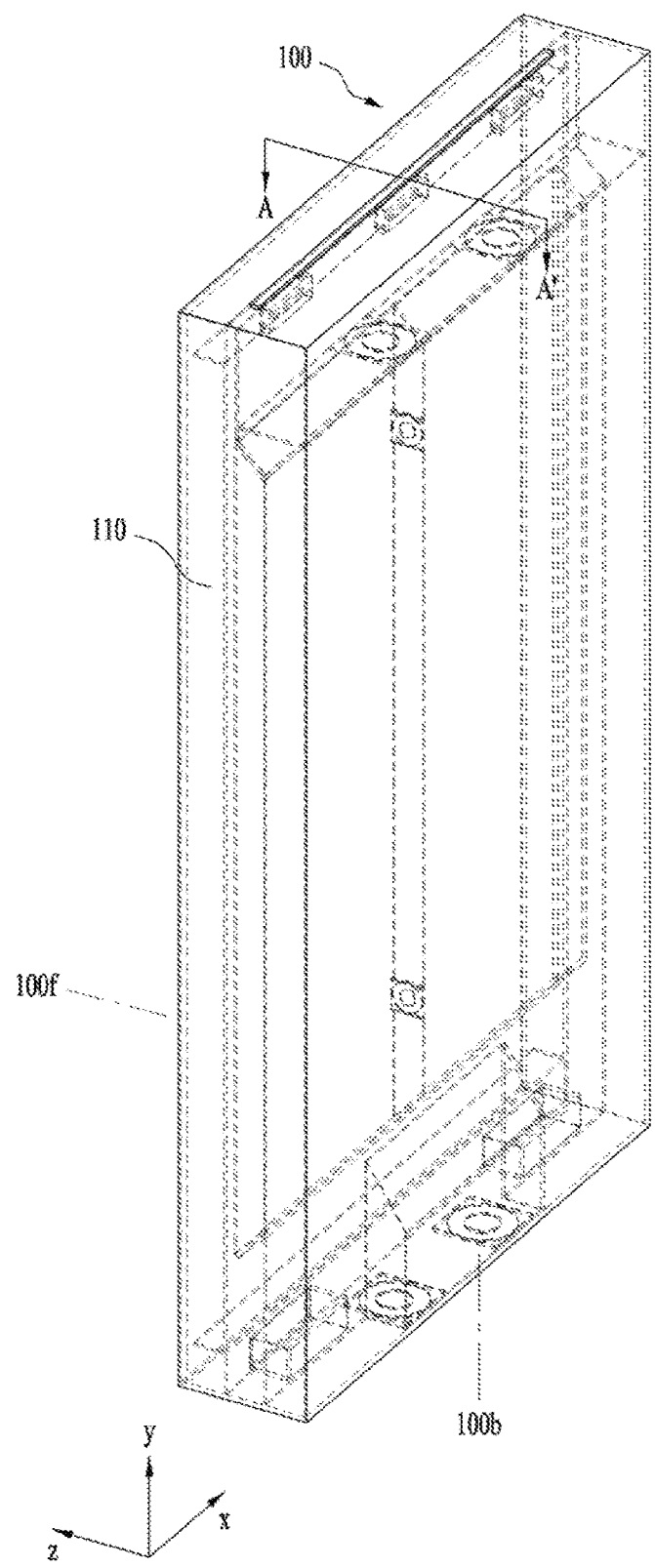
FIG. 5 is a rear perspective diagram of the display device.
Figure 6:
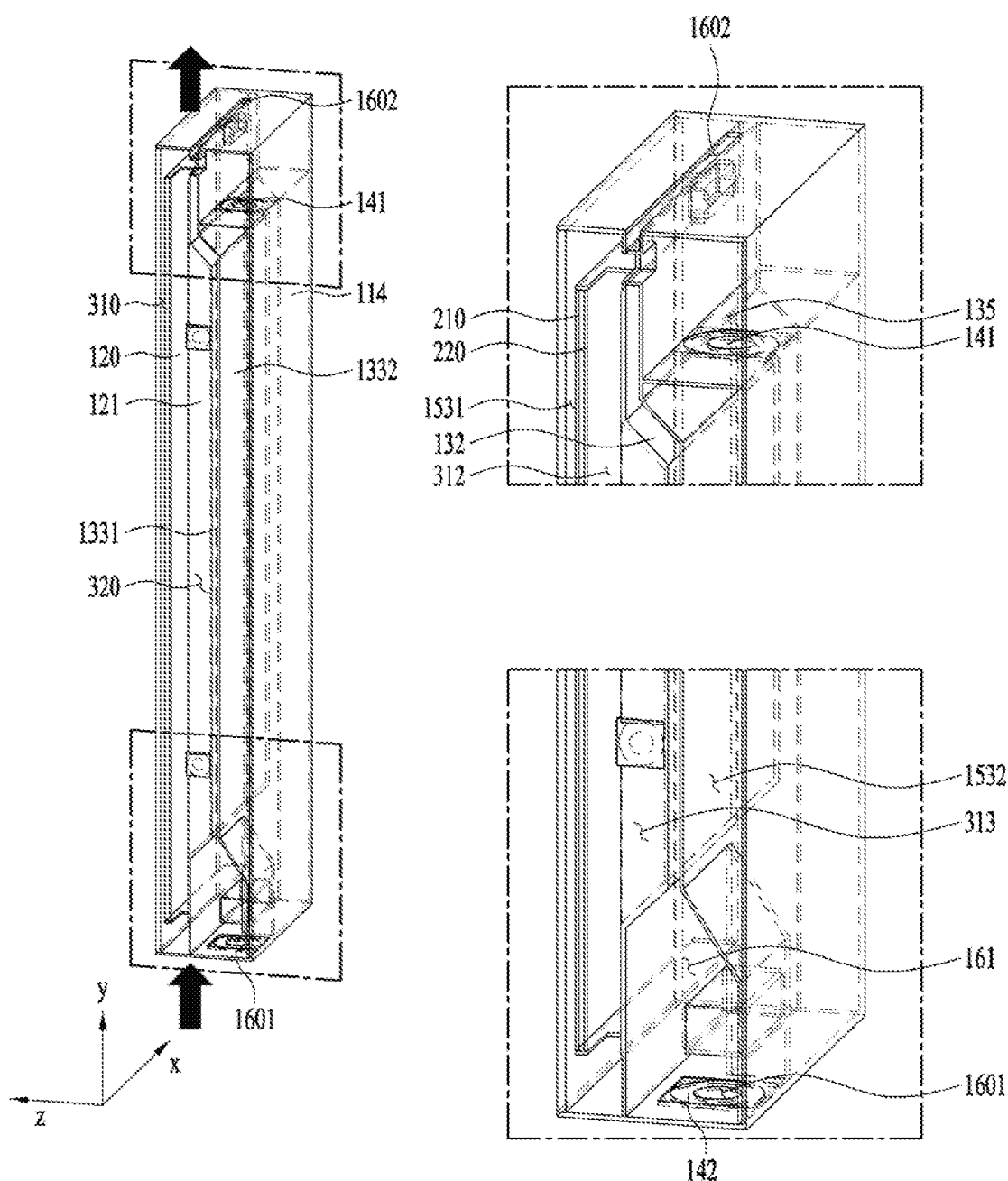
FIG. 6 is a sectional diagram along A-A' of FIG. 5.
Figure 7:
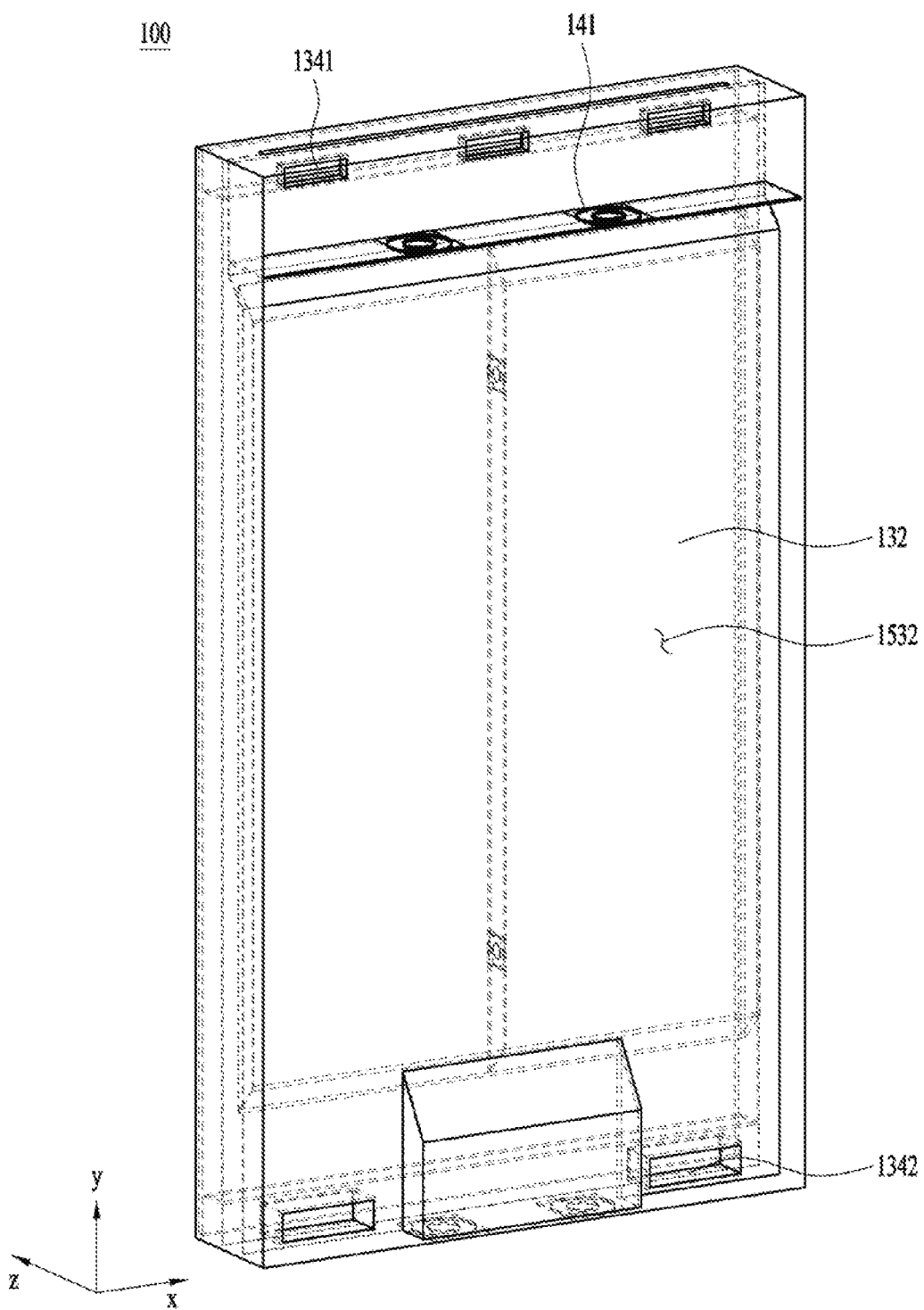
FIG. 7 is a diagram illustrating a state where a rear frame is removed from the example of the display device.
Figure 8:
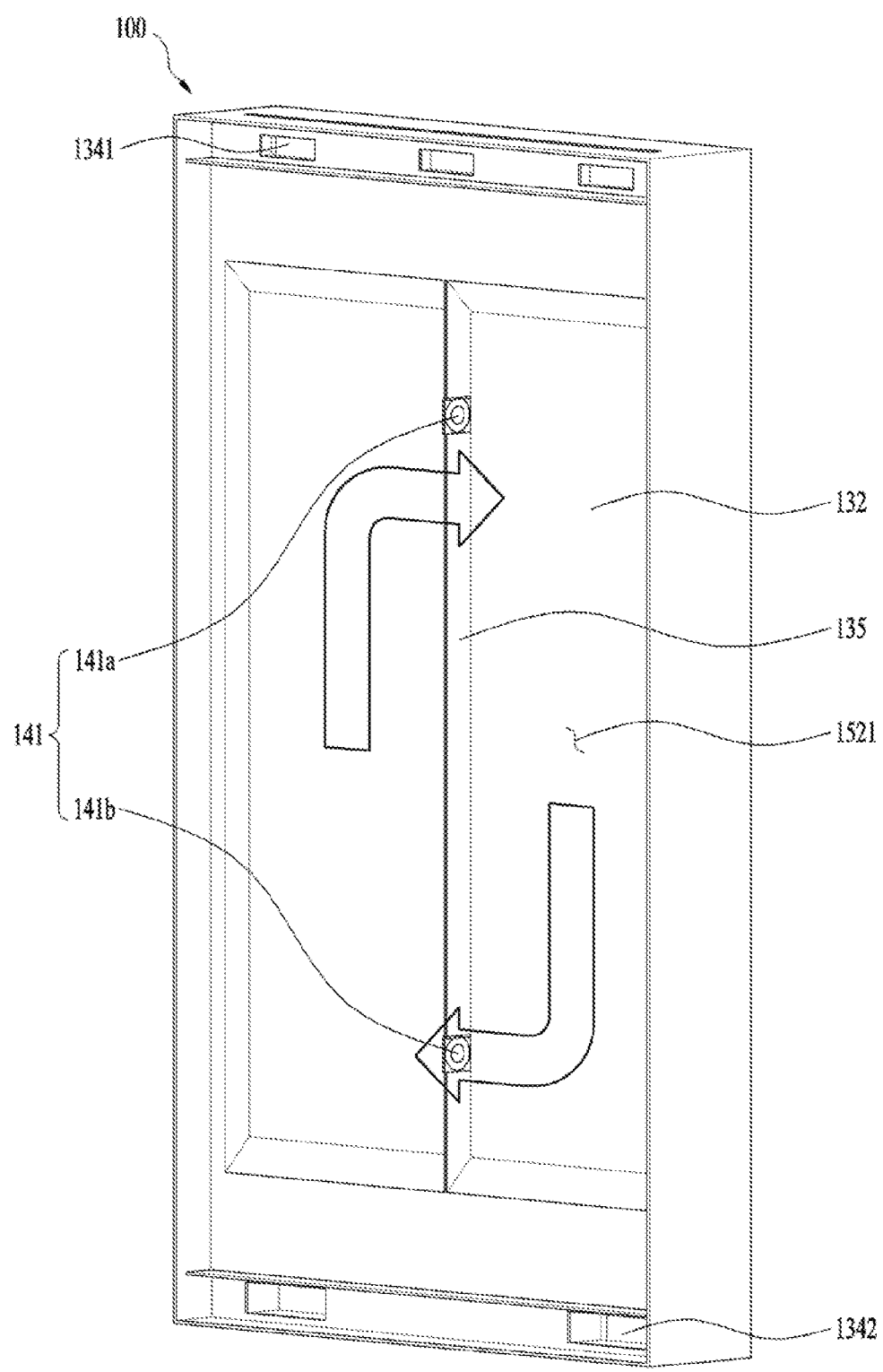
FIG. 8 is a diagram illustrating a state where a front frame and a display module are removed from the display device.

FIG. 5 is a rear perspective diagram of the display device 100. FIG. 6 is a sectional diagram along A-A' of FIG. 5. FIG. 7 is a diagram illustrating a state where a rear frame is removed from the example of the display device. FIG. 8 is a diagram illustrating a state where a front frame and the display module 200 are removed from the display device 100.

The display device 100 may have a polygonal shape. In other words, the outer case 110 of the display device 100 has an exterior defined by a plurality of outer surfaces which are toward different directions, respectively.

One surface of the display device 100 having the display is defined as a front surface of the display device 100. Another surface which supports the display device 100 with respect to the floor is defined as a lower surface of the display device 100.

An inlet 1601 and an outlet 1602 of the first open hole 161 may be formed in one surface and/or another surface of plural outer surfaces possessed by the outer case 110, respectively. In case the inlet 1601 and the outlet 1602 are provided in surfaces of the outer case, respectively, the possibility that the air exhausted from the outlet 1602 after receiving heat will be drawn into the inlet 1601 again may be minimized.

Especially, the inlet 1601 and the outlet 1602 of the first open hole 161 may be linearly formed in one surface of the outer case 110 and the other surface facing the surface. Refrigerant is able to pass the first open hole 161 penetrating the surface and the other one quickly and it is possible to minimize the turbulent flow which might be generated by a complex appearance.

An outer fan 142 is provided on the first open hole 161 so as to realize forcible convection.

More specifically, when the inlet of the first open hole 161 is provided in a lower surface of the display device 100 and the outlet 1602 thereof is provided in an upper surface of the display device 100, an effect of natural convection that heated air tends to rise is added and a higher heat radiation efficiency is able to be achieved.

The second space 312 where the rear surface of the optical sheet 220 and the front surface of the light source unit 230 are exposed may form a passage which is connected to the first closed passage 310.

The air having passed an upper portion of the display device 100 is branched from a rear space 1532 of the display device 100 and drawn into a front space 1001 of the display device and the second space 312.

The branched and drawn air of the first closed passage 310 flows to a lower end of the front space 1001 and a lower end of the second space 312 to be re-drawn into the rear space 1532 of the display device 100.

The first closed passage 310 is formed to circulate the front region and the rear region of the display device 100.

The circulation of the first closed passage 310 is facilitated via an upper end through hole 241 and a lower end through hole 241.

The second closed passage 320 is formed to be surrounded by the first closed passage 310 and disposed between the rear surface of the display module 200 and the inner case 132. Considering the thickness of the display device 100 and the heat radiation efficiency, it is preferred that the second closed passage 320 is formed with a narrow width and a broad area.

To form the forcible convection of the second closed passage 320, a circulation bracket traversing the first closed passage 310 and an inner fan 141 provided in the circulation bracket may be provide. For example, when the circulation bracket is provided in a longitudinal direction, two inner fans 141 are provided over and under the circulation bracket, respectively. One inner fan 141 provided over the circulation bracket may form flow from a left direction to a right direction and the other inner fan 141 provided under the circulation bracket may form flow in the reverse direction, so that the entire first closed space may become one roof.

As mentioned above, the reason why the inner fan 141 is provided it to maximize the heat radiation effect.

Figure 9:
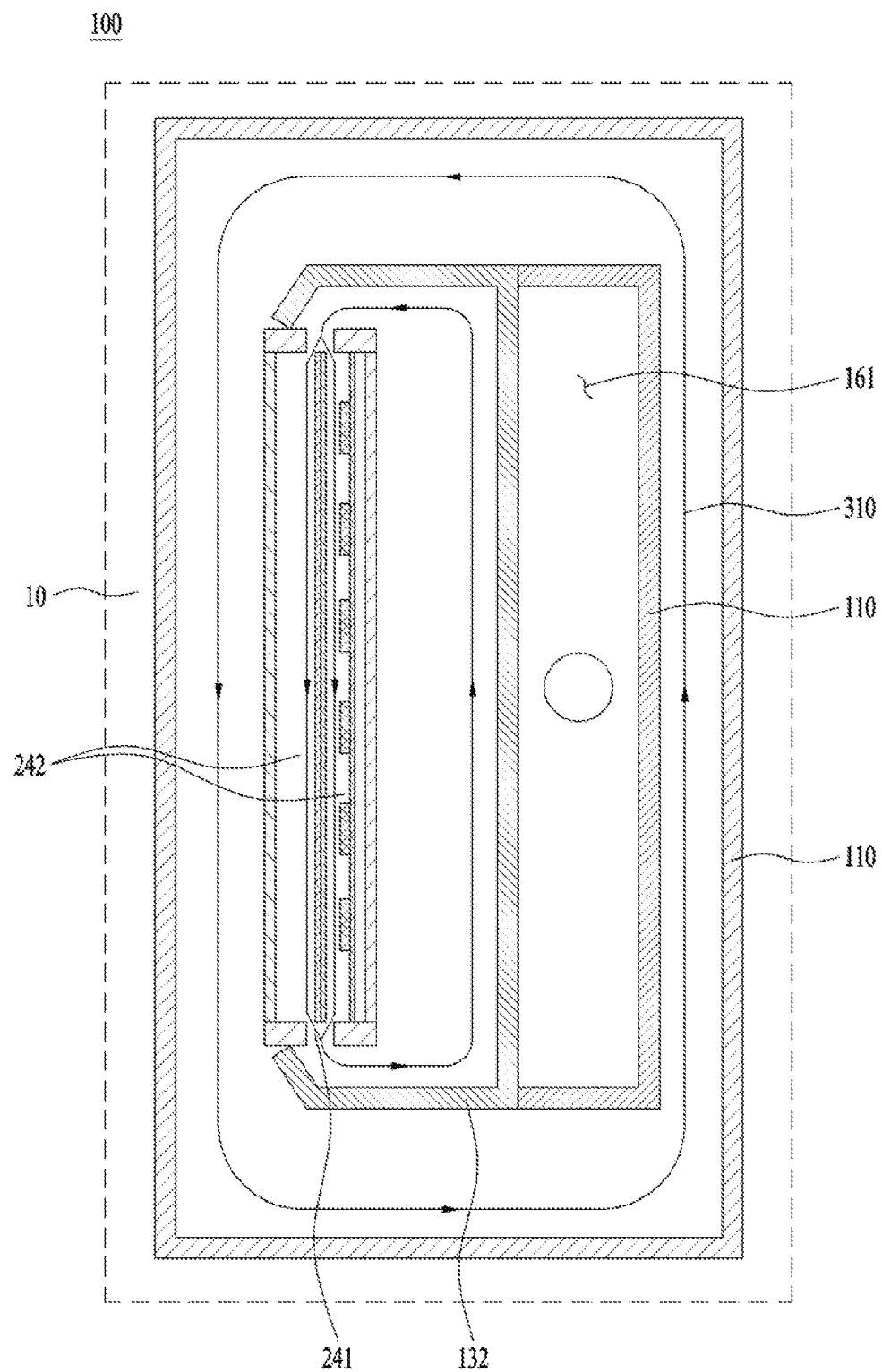
FIG. 9 is a sectional conceptual diagram illustrating one example of the display device in accordance with the present disclosure.

FIG. 9 is a sectional conceptual diagram illustrating one example of the display device 100 in accordance with the present disclosure.

In case the second closed passage 320 is surrounded along the first closed passage 310 by the inner case 132, the first passage 242 is disposed in the first closed passage 310 according to the embodiment of FIG. 2 or 4. However, the first passage 242 is disposed in the second closed passage 320 according to the embodiment of FIG. 9.

In other words, the inner case 132 shown in FIG. 9 surrounds some space having the through hole 241 of the display module 200 to form the second closed passage 320, different from the embodiment shown in FIG. 2 or 4 showing that the inner case 132 surrounds the space having no through hole 241 of the display module to form the closed passage 32.

When the through-hole 241 is formed over the first space 311 and the second space 312, the front surface of the display panel 210 is exposed to the first closed passage 310 and the rear surface of the display panel is exposed to the second closed passage 320. Accordingly, the heat generated in the display panel 210 may be dispersed to the first closed passage 310 and the second closed passage 320 advantageously.

As occasion occurs, the first passage 242 may be formed in one of the first, second and third spaces 311, 312 and 313.

The position of the first passage 242 is determined to be one of the spaces where much heat is generated or which is easy to form the through-hole 241.

Figure 10:
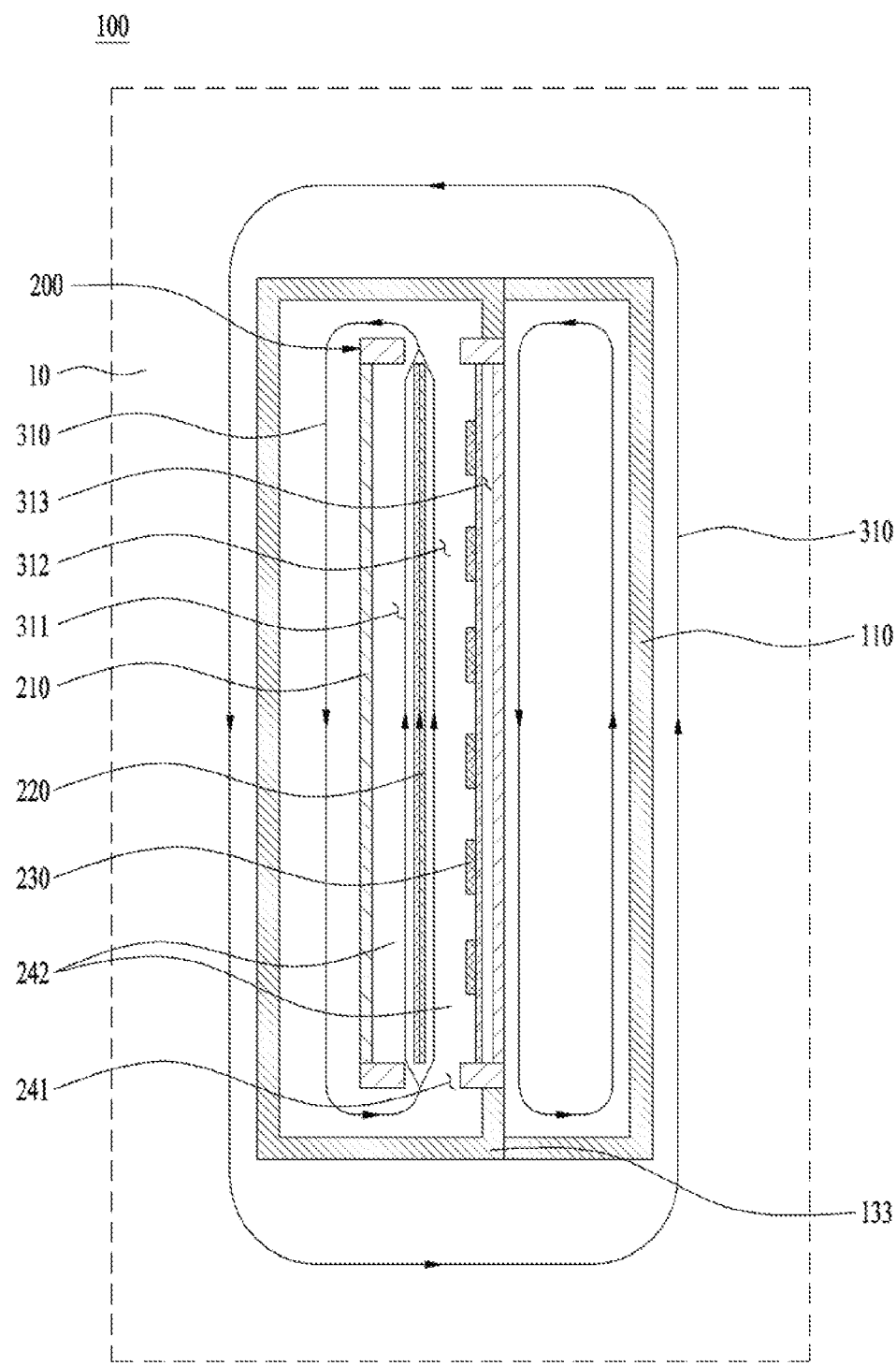
FIG. 10 is a sectional conceptual diagram illustrating one example of the display device in accordance with the present disclosure.

FIG. 10 is a sectional conceptual diagram illustrating one example of the display device 100 in accordance with the present disclosure.

A partition bracket 133 partitions off the internal space 150 of the display device 100 into two regions. The two regions partitioned by the partition bracket 133 may become the first closed passage 310 having the first passage 242 and the second closed passage 320 having no first passage 242.

Different from the embodiment shown in FIGS. 4 through 9, this embodiment is characterized in that the second closed passage 320 is capable of directly exchanging heat with the external space 10, without the first open hole 161.

The first passage 242 may penetrate at least one of the first through third spaces 311 through 313. The drawing illustrates that the first passage 242 penetrates the first space 311 and the second space 312.

Internal air of the display module 200 is exposed to the rear surface of the display panel 210 and the front surface of the light source unit 230 and then provided with heat. The air radiates the provided heat to the external space 10 via the outer case 110, while circulated along the first closed passage 310.

In contrast, internal air of the second closed passage 320 is exposed to the display module 200 and provided with the heat from the rear surface. The air radiates the provided heat to the external space 10 via the outer case 110.

Figure 11:
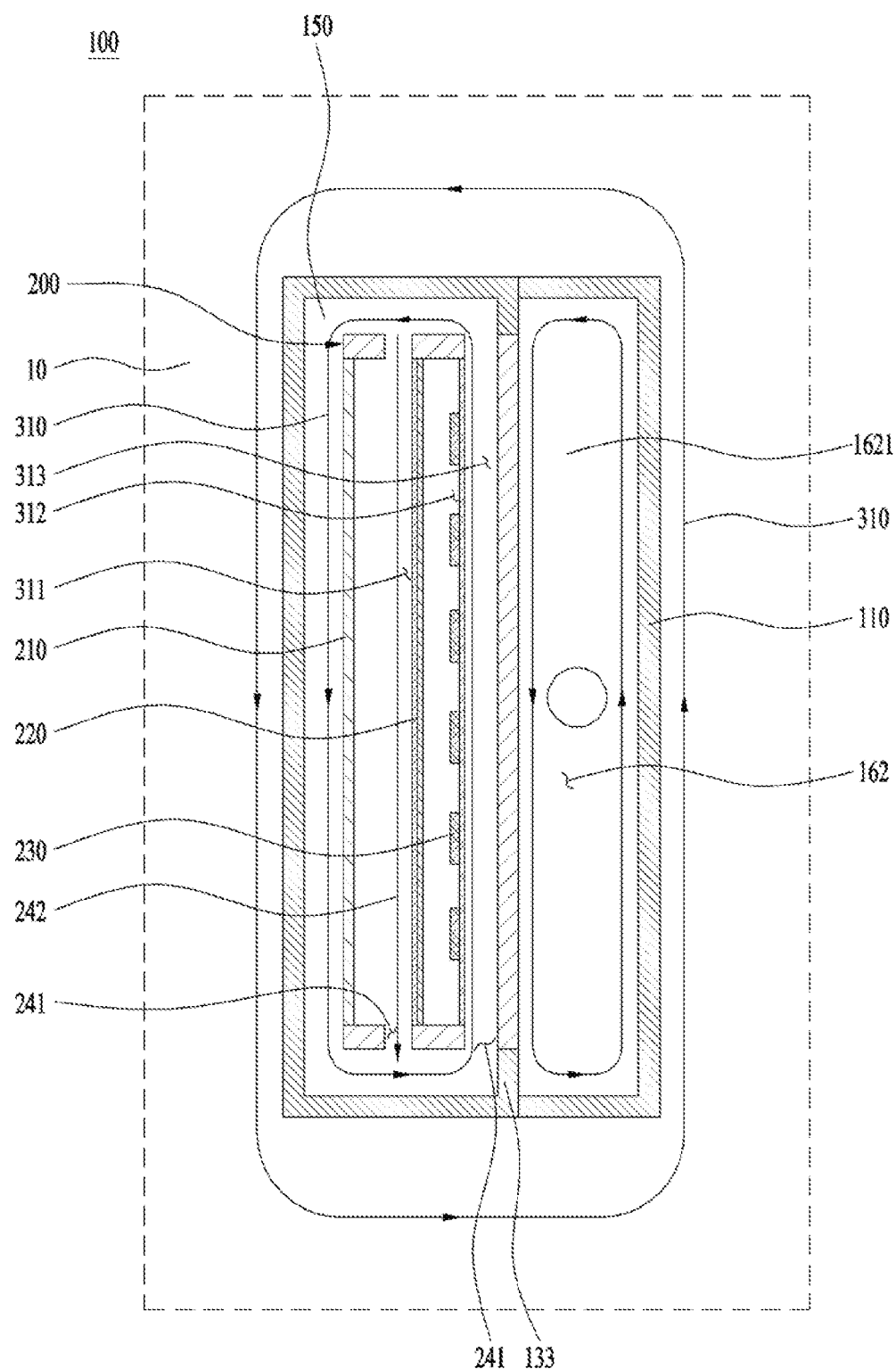
FIG. 11 is a sectional conceptual diagram illustrating one example of the display device.

FIG. 11 is a sectional conceptual diagram illustrating one example of the display device 100.

The second open hole 162 configured to form a second outer passage 1621 is surrounded by the second closed passage 320 according to this embodiment of FIG. 11, different from the embodiment of FIG. 10.

The outer case 110 may be partitioned off from the internal space 150 and include a second open hole 162 which is provided in the external space 10.

More specifically, the second open hole 162 has only the heat of the second closed passage 320 transmitted therein and exhausted there from, which is different from the first open hole 161 has the heat of the first and second closed passages 310 and 320 transmitted therein and exhausted therefrom.

The second open hole 162 is partitioned off from the internal space 150 and provided in the external space 10. Accordingly, only heat is transmitted to the second open hole 162 from the internal space 150, while no materials are transmitted, to perform the heat radiation of the display device 100.

The heat generated in the display module 200 is able to be radiated via the first passage 242 penetrating the display module 200 and the heat generated in the other electronic components except the display module 200 may be radiated via the external space 10 of the display device 100. Accordingly, each region has high heat radiation efficiency.

Especially, FIG. 11 illustrates the present characteristic that the first passage 242 penetrates the first space 311 and the third space 313. The through-hole 241 may include two inlet through-holes 241 and two outlet-through holes 241.

The penetration position of the first passage 242 is not limited to the present embodiment. Alternatively, the first passage 242 may be provided in at least one of the first, second and third spaces 313.

Figure 12:
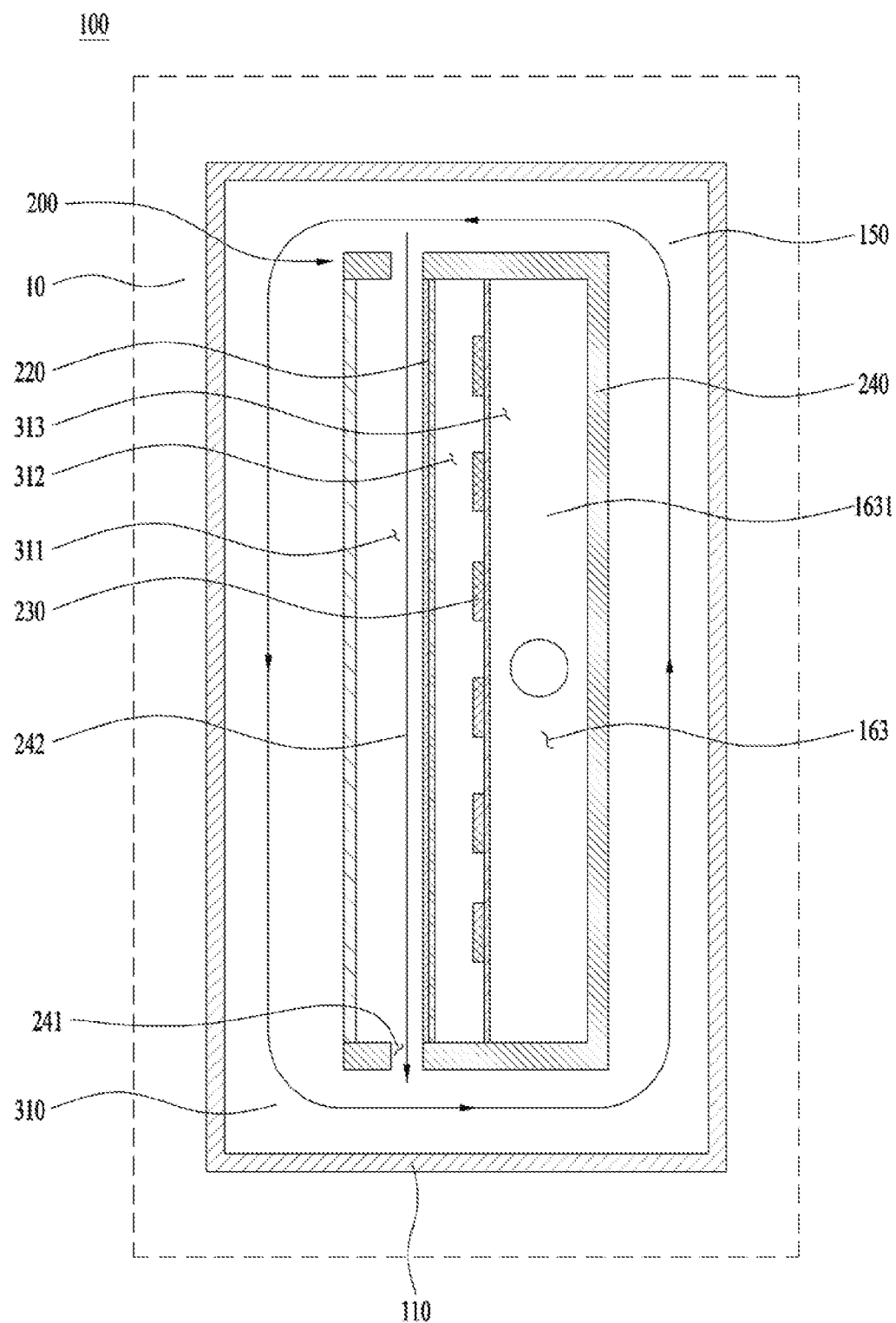
FIG. 12 is a sectional conceptual diagram illustrating one example of the display device.

FIG. 12 is a sectional conceptual diagram illustrating one example of the display device 100.

The module case 240 may include a third hole 163 for forming a third outer passage 1631. In other words, the third hole 163 may be provided in the display module 200, different from the first or second open hole 161 or 162.

The third hole 163 may be formed by the outer case 110 so as to be located in the external space 10 partitioned off from the internal space 150.

The third hole 163 may be formed in the third space 313 of the display module 200.

Accordingly, the heat of the second space 312 and the heat of the first closed passage 310 are able to be radiated to the third space 313 via the third hole 163. The heat of the third space 313 is directly connected to the external space 10 and configured to perform heat radiation.

No auxiliary space for forming the second closed passage 320 is required so that the overall thickness of the display device 100 can be thin. Especially, the heat of the rear surface of the light source unit 230 is directly connected and radiated to the external space 10, so that heat radiation efficiency can be enhanced.

It is necessary to prevent air from flowing into the second space 312 of the display module 200 or the first closed passage 310 from the external space 10 by increasing confidence in sealing between the rear surface of the light source unit 230 and the module case forming the third hole 163.

The heat passing through the first closed passage 310 may be radiated via the third hole 163 as well as the external space 10 of the display device 100 simultaneously.

The through-hole 241 may be formed in the spaces to form the first passage 242 in the first space 311 or the second space 312.

Figure 13:
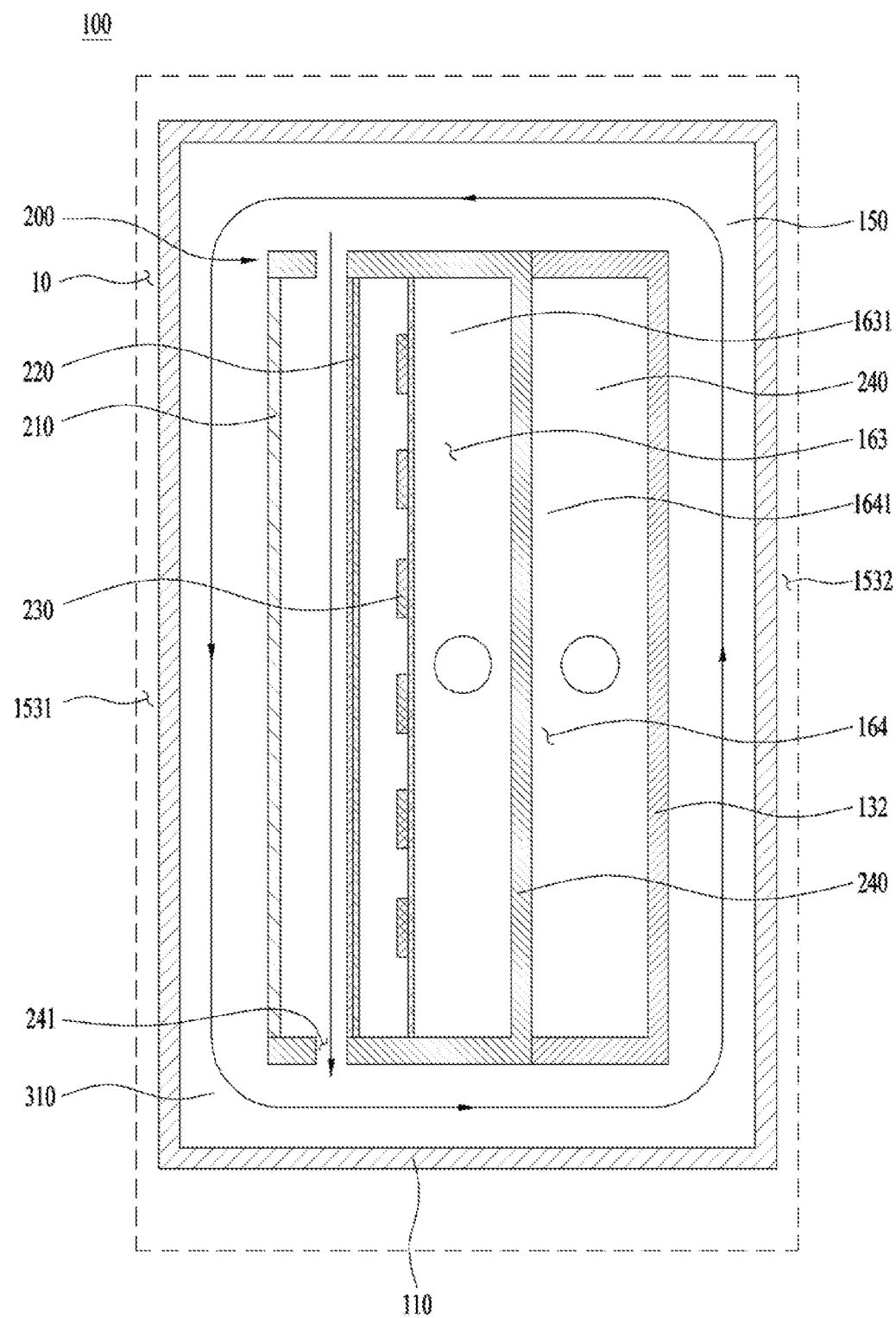
FIG. 13 is a sectional conceptual diagram illustrating one example of the display device.

FIG. 13 is a sectional conceptual diagram illustrating one example of the display device 100.

Based on the embodiment of FIG. 12, the outer case 110 may further include a fourth hole 164 for forming a fourth outer passage 1641. The outer case 110 may be partitioned off from the internal space 150 and located in the external space 10.

The fourth hole 164 may be formed to face the third hole 163 in close contact. In other words, one region of the fourth hole 164 faces the third hole 163 and the other region is in close contact with the first closed passage 310.

According to the embodiment of FIG. 12, it is likely to be difficult to radiate heat from air inside the first closed passage 310 via the third hole 163 in case much heat is generated in the third space 313 by the light source unit 230 and the like.

The present embodiment illustrates the present embodiment illustrates that the first passage 242 penetrates the first space 311. Alternatively, the first passage 242 may be formed in the second space 312 or over both of the first and second spaces 311 and 312.

Figure 14:
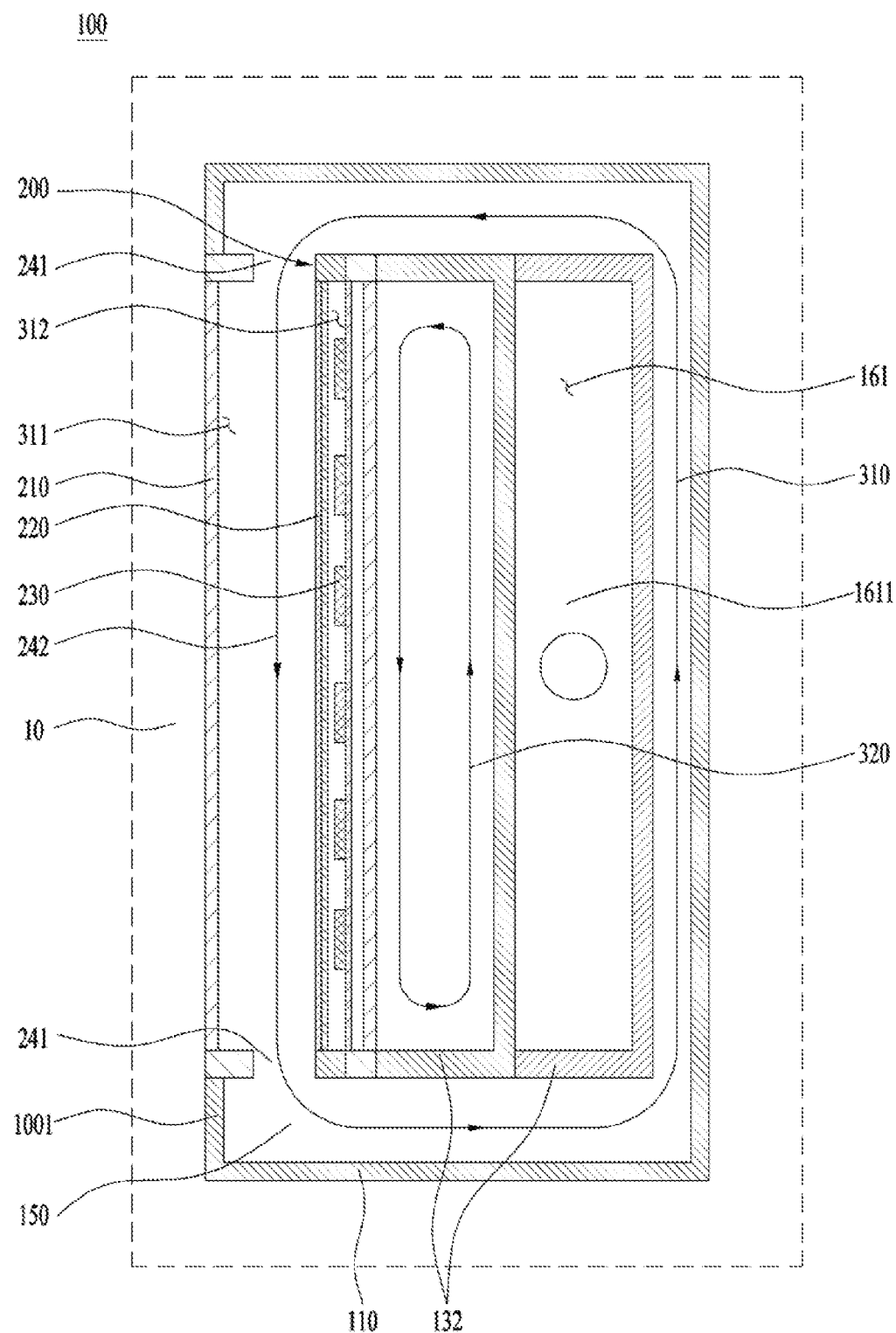
FIG. 14 is a sectional conceptual diagram illustrating one example of the display device.

FIG. 14 is a sectional conceptual diagram illustrating one example of the display device 100.

The embodiment of FIG. 4 illustrates that the front of the display module 200 is separated and spaced a preset distance from the front surface of the display 100. However, the present embodiment illustrates that no distance or space is formed between the front surface of the display module 200 and the front surface of the display device 100 to form no passage.

To realize such a type, the display device 100 includes a window provided in the front surface and a rear surface of the window is coupled to the front surface of the display panel, with a gap or space sealed there between.

Alternatively, the display module 200 with no window may be coupled to the front surface of the display device 100 with a hole.

As occasion occurs, the window is omitted and the front surface of the display module 200, in other words, the display panel 210 may be exposed to the front surface 1001 of the display device.

The coupling between the display module 200 and the front surface 1001 of the display device may be realized as screw coupling, hook coupling or adhesive tape coupling.

The first passage 242 may be formed through the first space 311 or the second space 313 of the display module 200.

Due to the present characteristic, the space 3141 between the front surface of the display panel 210 and the front surface 1001 of the display device can be minimized so that visibility can be improved and that the heat generated in the front surface of the display panel 210 can be directly radiated to the external space 10 and the heat generated from the rear surface of the display panel 210 can be radiated vi the first passage 242 formed in the first space 311 enough to enhance heat radiation effect.

Moreover, it is possible to realize the slime display device with the overall thin thickness.

The first open hole 161 may be provided between the first closed passage 310 and the second closed passage 320. In other words, one region of the first open hole 161 may be in contact with the first closed passage 310 and another region may be in contact with the second closed passage 320.

The characteristics of the first open hole 161 are equal to those of the first open hole described in the embodiment of FIG. 4.

The display device 100 of the preset embodiment may be configured of the first closed passage 310 passing through the first passage 242; the second closed passage 320 surrounding the first closed passage 310; and the first outer passage 1611 passing through the first open hole 161 provided between the first closed passage 310 and the second closed passage 320.

Figure 15:
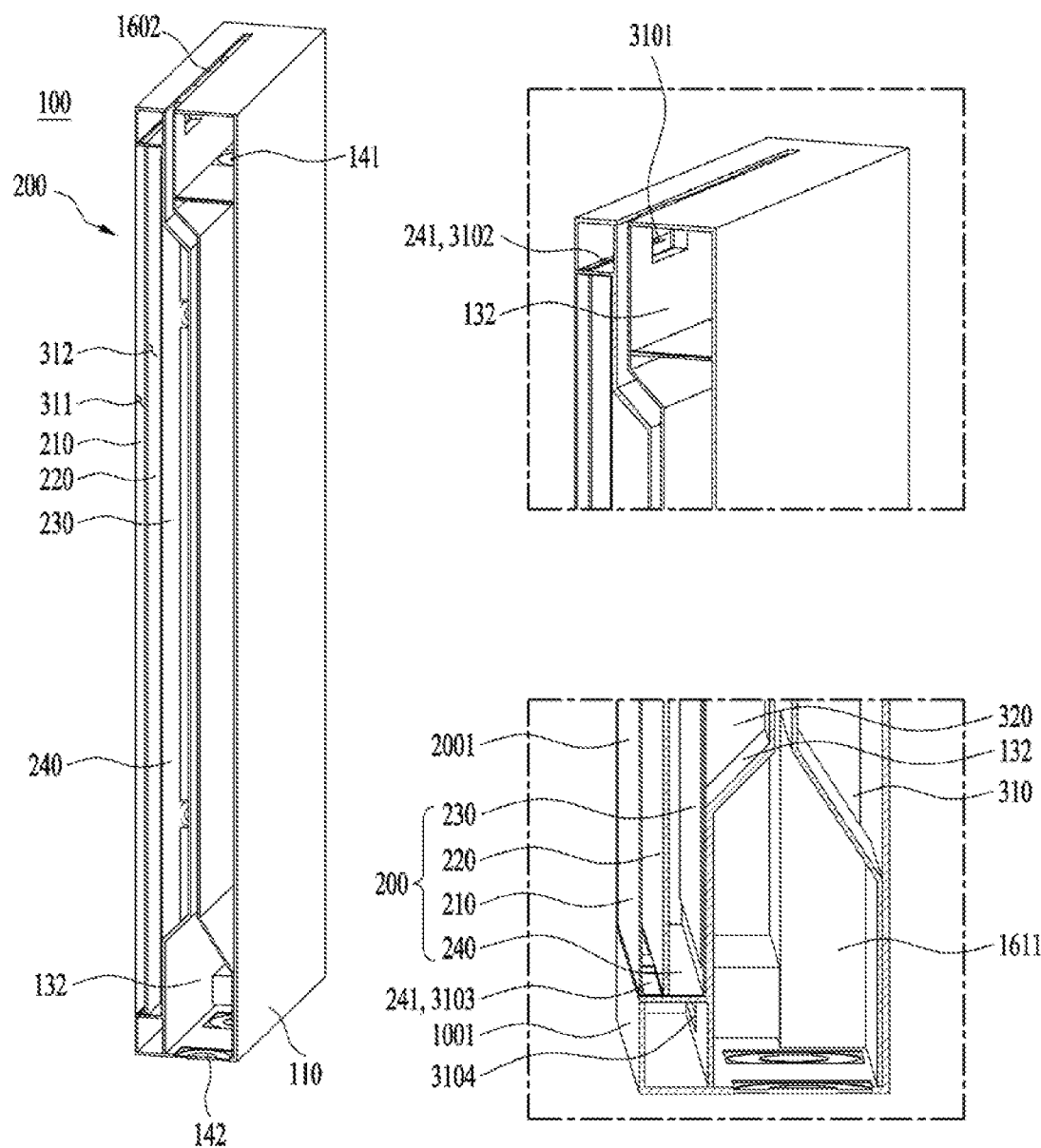
FIG. 15 is a sectional diagram illustrating one specific embodiment of the display device shown in FIG. 14.

FIG. 15 is a sectional diagram illustrating one specific embodiment of the display device 100 shown in FIG. 14.

The front surface of the display module 200 is exposed to the front surface of the display device 100.

The first passage 242 is formed in the first space 311 which is the space formed between the display panel 210 and the optical sheet 220. As occasion occurs, the first passage 242 may be formed in the second space 312.

Air flow is formed in the first closed passage 310 from the inner fan 141 and the first closed passage 310 is provided with heat of the first space 311 after passing through a first hole 3101 and then a second hole 3102 as the inlet 1601 of the first passage 242. Hence, the air provided with the heat of the first space 311 is re-drawn into the inner fan 141 of the rear surface space 1532 of the display device 100 after passing through a third hole 3103 and a fourth hole 3104, only to form the first closed passage 310.

Air flow is formed in the first outer passage 1611 from the outer fan 142 and the air is exhausted to an outlet 1602 of the first hole 161.

The other characteristics of the present embodiment are equal to those of the embodiments shown in FIGS. 4 through 8.

Figure 16:
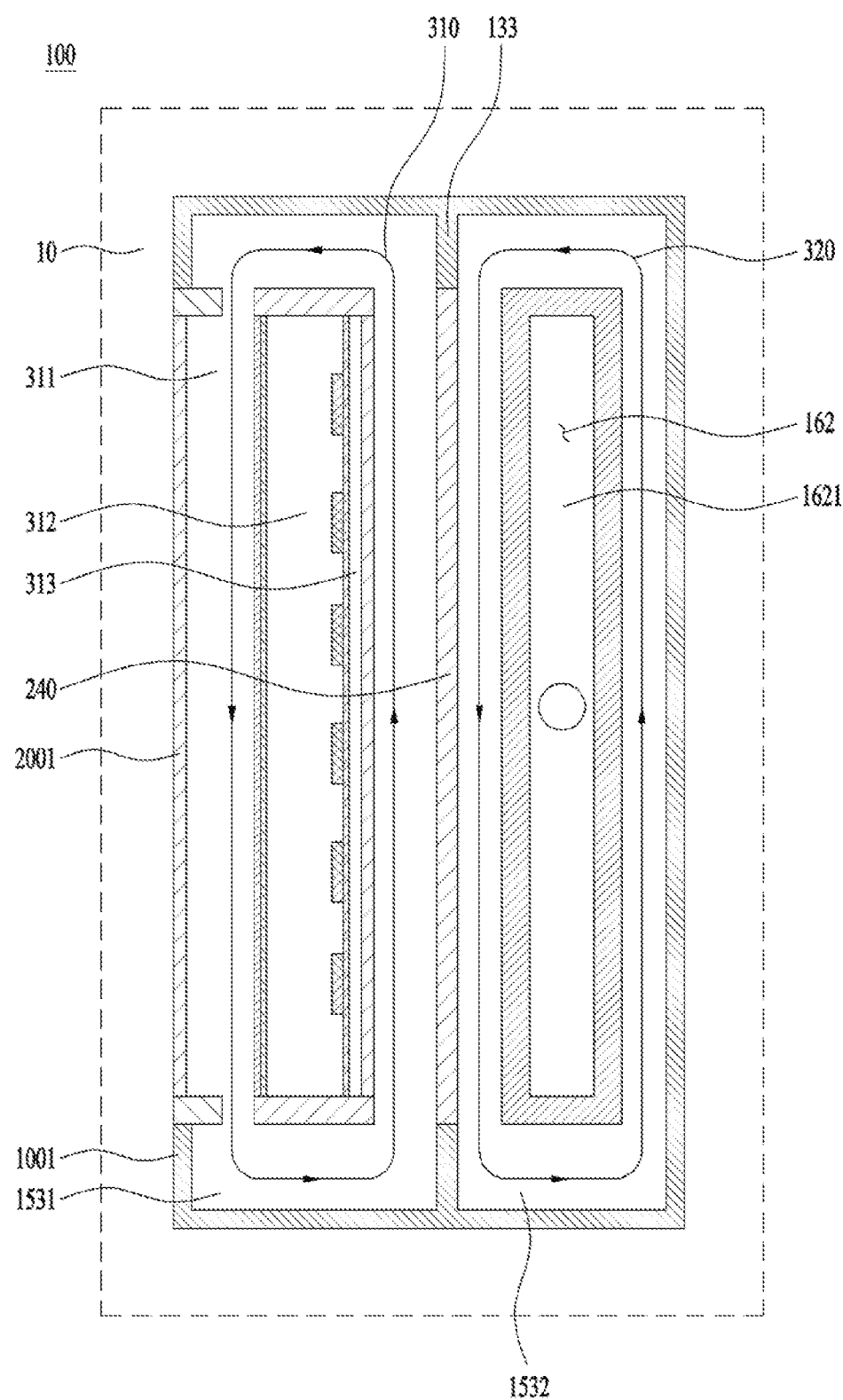
FIG. 16 is a sectional conceptual diagram illustrating one example of the display device.

FIG. 16 is a sectional conceptual diagram illustrating one example of the display device 100.

The embodiment of FIG. 16 includes some characteristics of the embodiment shown in FIG. 14 that no space or gap 3141 is formed between the front surface of the display module 200 and the front surface of the display device 100.

A partition bracket 133 partitions a region of the display device 100 into a front surface region and a rear surface region, so that closed passages may be formed in the regions, respectively. The partition bracket 133 partitions the region into the front surface region and the rear surface region in the display device 100.

The through-hole 241 may penetrate at least one of the first through third spaces 311 through 313 to form the first passage 242.

For example, the through-hole 241 may be formed for the first passage 242 to penetrate the first space 311 and the third space 313.

The first closed passage 310 circulates the front surface space 1531 of the display device and the second closed passage 320 circulates the rear surface space 1532 of the display device.

The first closed passage 310 radiates the heat generated in the display module 200, while circulating the third space 313, the external space 10 and the first space 311 of the display module and then the external again.

The second closed passage 320 circulates around the second outer passage 1621 formed by the second open hole 162.

Figure 17:
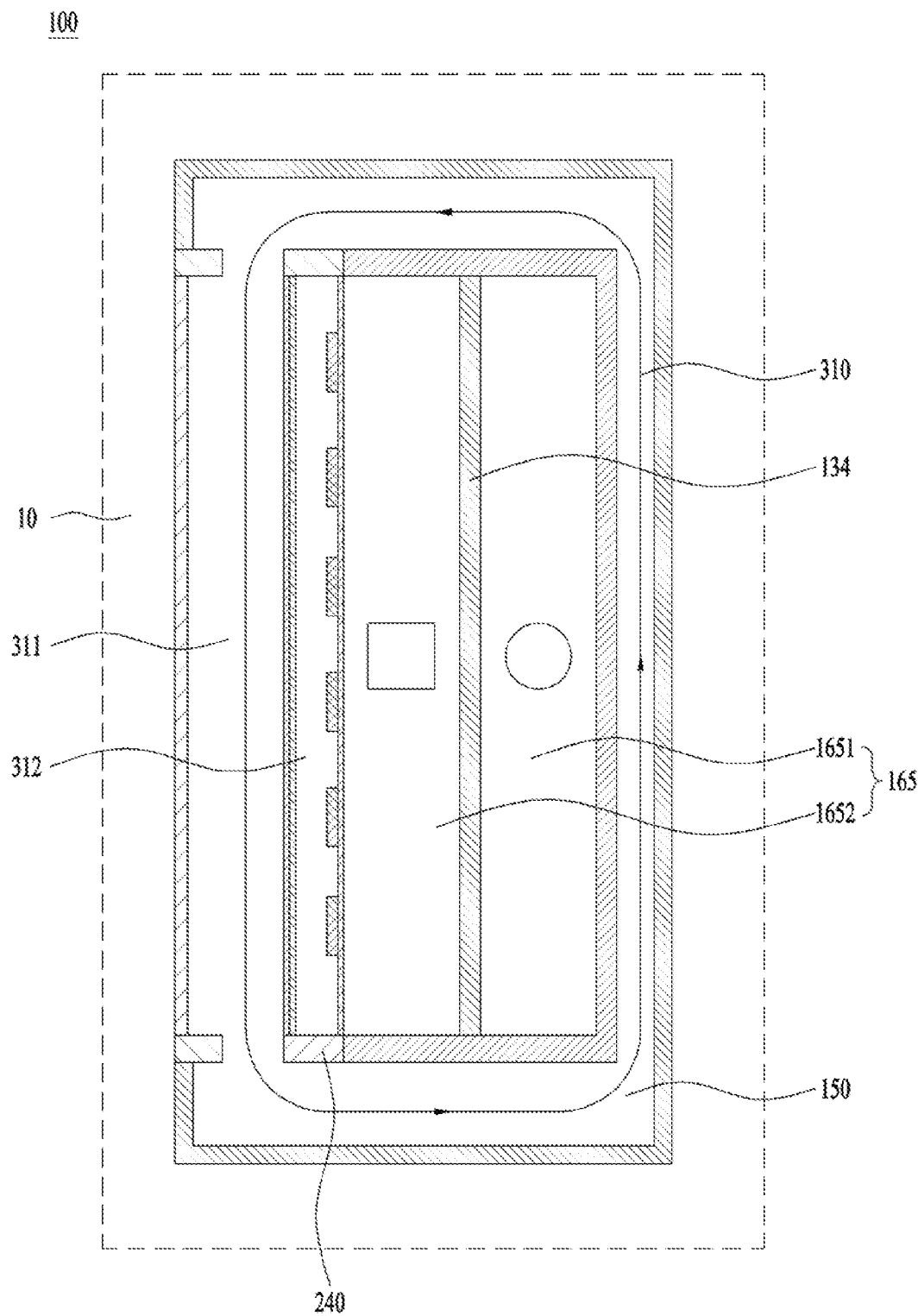
FIG. 17 is a conceptual diagram illustrating another example of the display device in accordance with the present disclosure.

FIG. 17 is a conceptual diagram illustrating another example of the display device 100 in accordance with the present disclosure.

In the display device 100 in accordance with the embodiments mentioned above, the inlet 1601 and the outlet 1602 of the open hole are toward different directions. In other words, the inlet 1601 of the open hole is formed in one of outer surfaces of the display device 100, of which each is toward a different direction, and the outlet 1602 is formed in another one of the outer surfaces.

However, in the display device 100 in accordance with the embodiment of FIG. 17, the inlet 1601 and the outlet 1602 of the open hole may be formed in one surface of the outer surfaces as a fifth open hole 165.

When the inlet 1601 and the outlet 1602 of the open hole are provided in one surface, the entire path of the fifth open hole 165 is able to be formed long in a relatively small area advantageously.

The fifth open hole 165 may be divided into a first heat radiation portion 1651 as one path and a second heat radiation portion 1652 as the other path y the division bracket 134.

Air flows in the first heat radiation portion 1651 in a first direction and air flows in the second heat radiation portion 1652 in a second direction.

For easy description sake, an outlet direction of the air flow with respect to one cross section is referred to as 'O' and an inlet direction of the air flow is referred to as 'X'. When the first heat radiation portion 1651 has 'O air flow' and the second heat radiation portion 1652 has 'X air flow' as shown in FIG. 17, the first and the second direction are in reverse.

The front surface of the display module 200 is coupled to the front surface of the display device 100, so as to form no passage and expose the front surface 2001 of the display module to the front surface of the display device. Although not shown in the drawings, the front surface of the display module 200 and the front surface of the display device 100 may be spaced a preset distance apart from each other enough to form a space.

The first passage 242 may be formed in the first space 311 to form the first closed passage 310. Although not shown in the drawing, the first passage 242 may be formed in the second space 312 or both of the first and second spaces 311 and 312.

Figure 18:
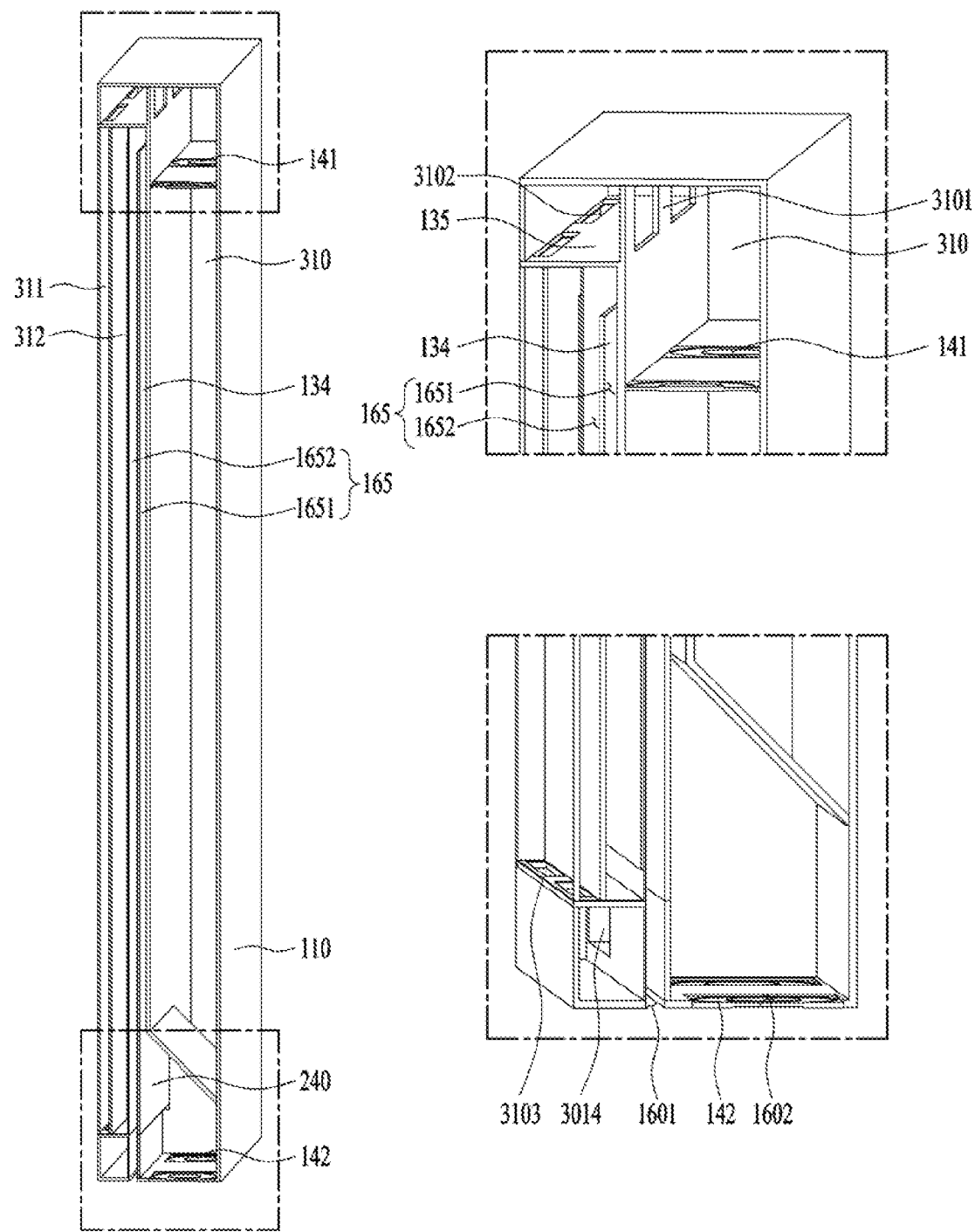
FIG. 18 is a diagram illustrating one specific embodiment of the display device shown in FIG. 17.

FIG. 18 is a diagram illustrating one specific embodiment of the display device 100 shown in FIG. 17.

FIG. 18 illustrates a longitudinal sectional diagram of the display device 100.

The other structural characteristics of the embodiment shown in FIG. 18 are equal to those of the embodiment shown in FIG. 15, except ones which will be described hereinafter.

The inlet 1601 and the outlet 1602 of the first open hole 161 may be provided on surface of the display device 100, especially, a lower surface of the display device 100.

Alternatively, the inlet 1601 and the outlet 1602 of the first open hole 161 may be provided in a first region and a second region, respectively, which are adjacent to each other on the same surface.

The division bracket 134 partitions off the first open hole 161 into the inlet 1601 and the outlet 1602 of. The air having passed the inlet 1610 of the first open hole 161 rises to an upper end and then it is bent toward the outlet 1602 of the first open hole 161 to be exhausted.

In case heat conductivity is high in the division bracket 134, the division bracket 134 functions as a heat radiation plate for radiating the heat generated in the display device 100 so that it may broaden an overall surface area to help an effective heat radiation.

In case the inlet 1601 and the outlet 1602 of the first open hole 161 are provided in the lower surface of the display device 100, the foreign substances of the external space 10 such as dust which might be drawn into the inlet 1601 may be minimized.

In case the inlet 1601 and the outlet 1602 of the first open hole 161 are provided in the lower surface of the display device 100, it is preferred that the inlet 1601 of the first open hole 161 is provided in the front region or the rear region of the display device 100 based on the amount of the heat, in other words, in the region where more heat is generated. It is effective in the heat radiation efficiency to make the direction of the forcible convection which is raised by the outer fan 142 be equal to the direction of the natural convection which is raised by relatively hot air.

Although not shown in the drawing, the inlet 1601 and the outlet 1602 may be formed in the reverse direction.

A guide bracket 135 is configured to guide the air flow of the first open hole 161. Especially, in the present embodiment, the guide bracket 135 guides air flow in the region where the air flow is changed from the first heat radiation portion 1641 to the second heat radiation portion 1642.

The entire first open hole 161 together with the guide bracket 135 and the division bracket 134 may form a ⊏-shaped passage. The ⊏-shape may become one example possessed by the first open hole bent once, with a high heat radiation efficiency.

Figure 19:
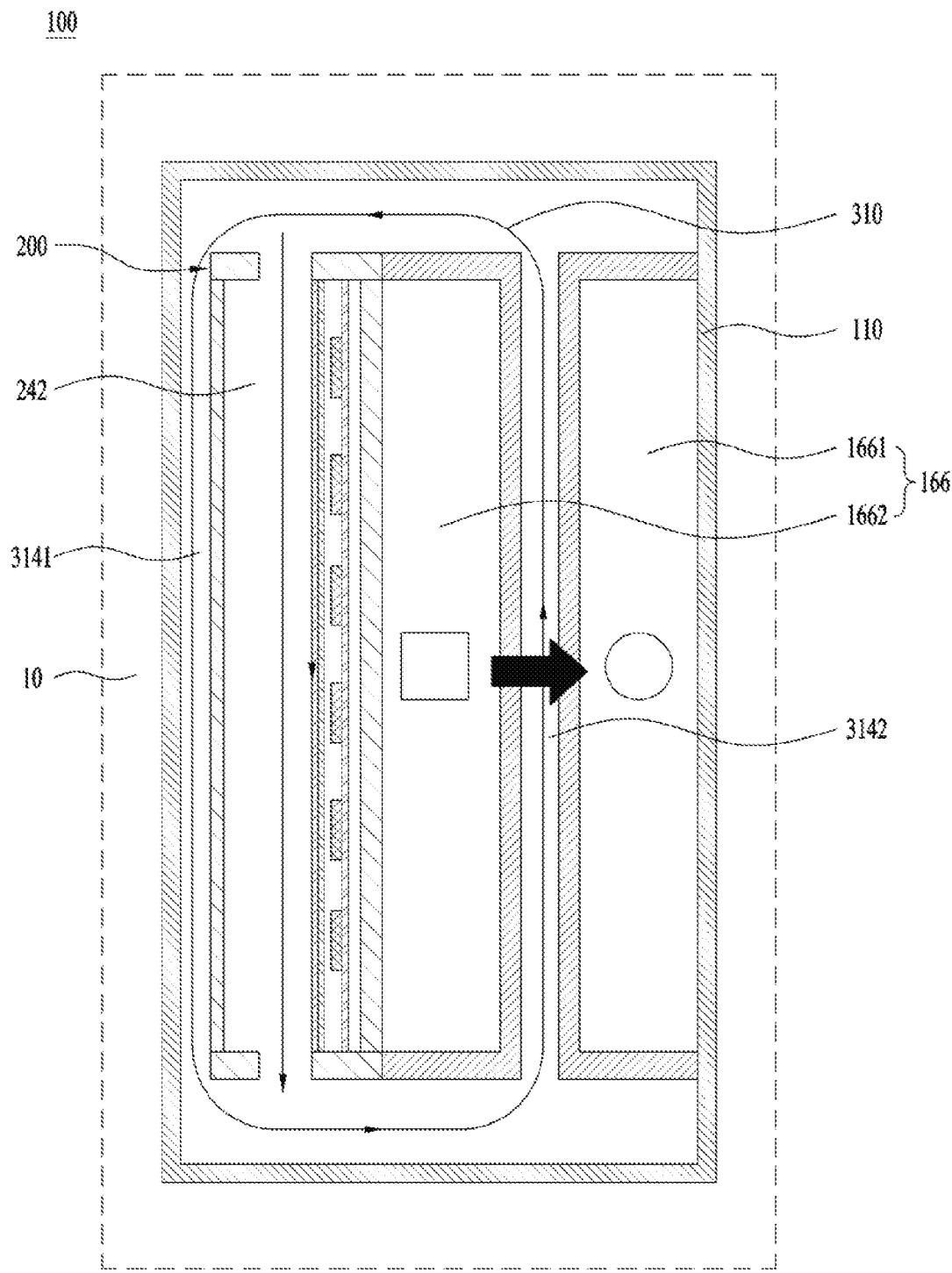
FIG. 19 is a diagram illustrating one example of the display device.
Figure 20:
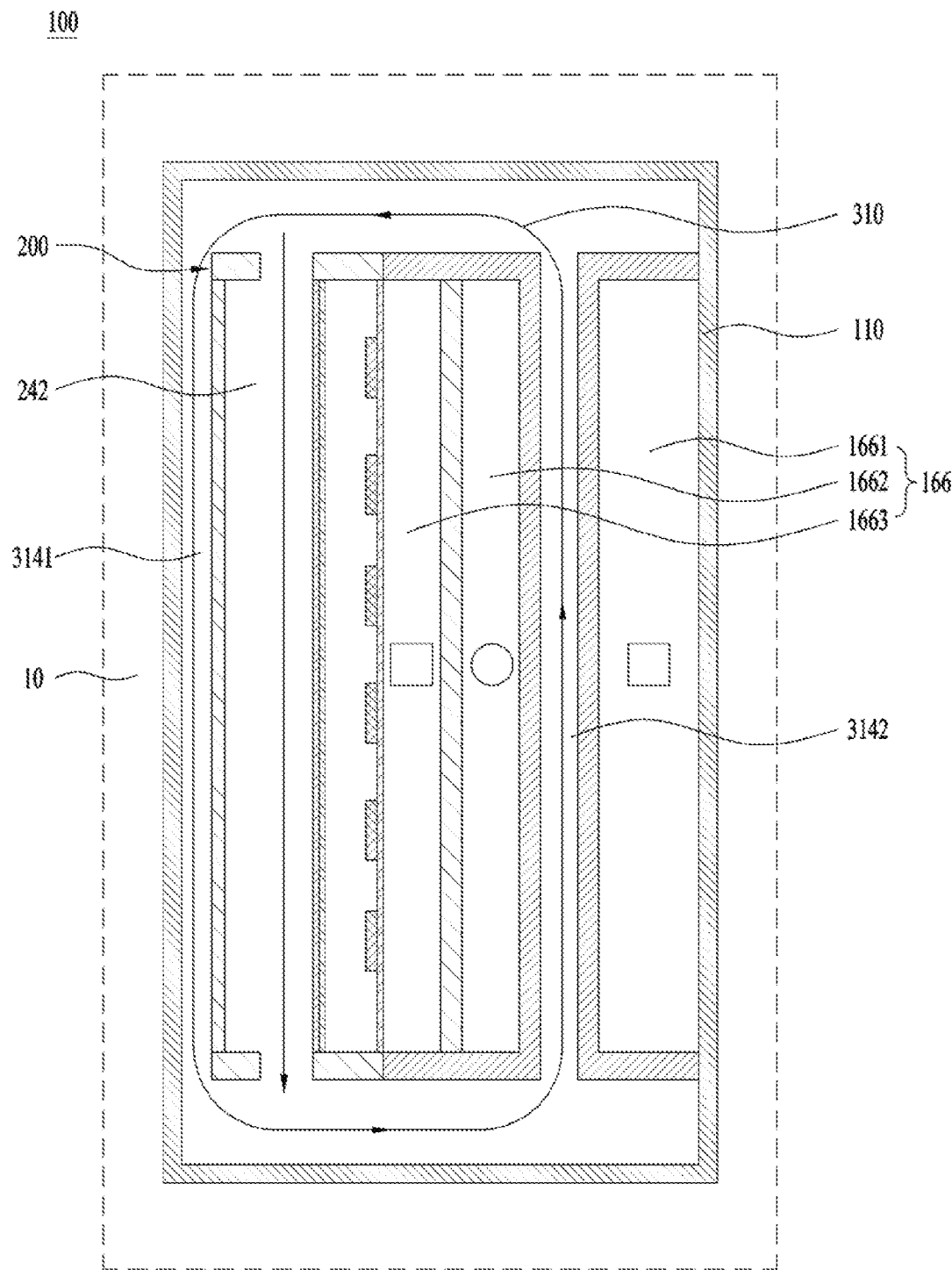
FIG. 20 is a diagram illustrating one example of the display device.

FIGS. 19 and 20 are diagrams illustrating one example of the display device 100.

The display device of FIGS. 19 and 20 may include a plurality of heat radiation portions and the heat radiation portions are spaced a preset distance apart from each other. Especially, the rearmost one of the heat radiation portions is provided in the rear surface of the display device 100. When the rearmost one is a first heat radiation portion 1641, the first heat radiation portion 1641 may define the rearmost surface of the display device 100.

The reason why the first heat radiation portion 1641 is spaced apart and located in the rearmost surface is to enhance the heat radiation efficiency.

Such the spaced-apart structure of the heat radiation units may stop the heat of the other heat radiation portion from moving to the first heat radiation portion and the heat of the space 3142 is transmitted to the first heat radiation portion 1641 and a second heat radiation portion 1642 simultaneously.

High-temperature air is exhausted via the outlet 1602 by arranging an open hole in an outer surface and heat is radiated by the external 10 simultaneously.

In other words, the other electronic components except the display module 200 such as the drive unit and the control unit may be loaded in the space 3142 of the display device rear surface space 1532. The heat generated from the electronic components arranged in the space 3142 may be radiated quickly by the plurality of the heat radiation portions surrounding the space.

FIG. 19 illustrates that two heat radiation portions are provided and FIG. 20 illustrates that three heat radiation portions are provided. When three heat radiation portions are provided, the inlet 1601 and the outlet 1602 may be provided in the same one surface of an outer frame of the display device 100.

Especially, FIGS. 19 and 20 illustrate that the front surface of the display module 200 and the front surface of the display device 100, in other words, the window are spaced apart from each other.

Accordingly, heat of air inside the region having the electronic components such as the drive unit and the control unit may be radiated, while circulating via at least one of the first through third spaces 311 through 313 of the display module 200 and the front space 3141 of the display module 200.

Figure 21:
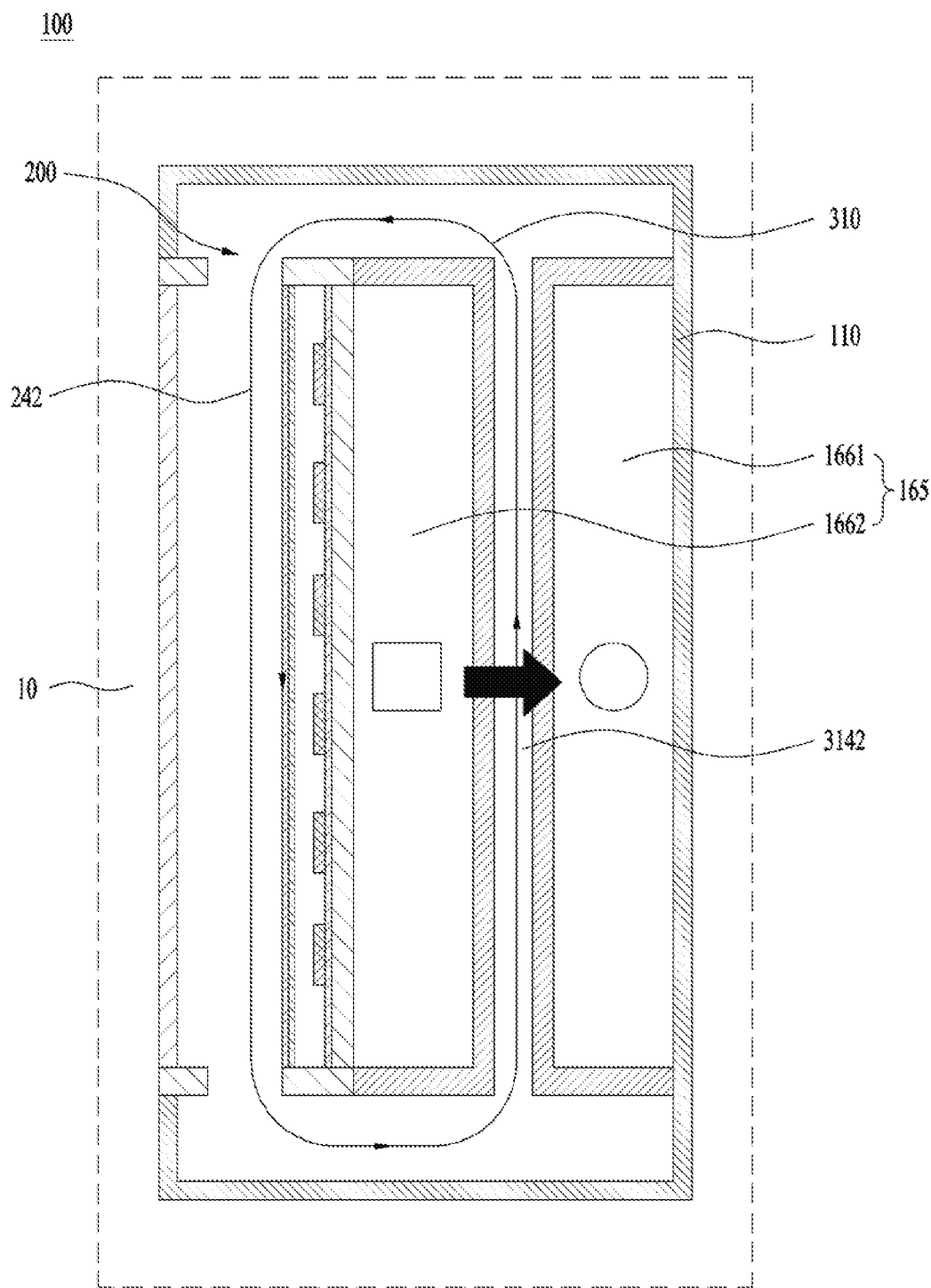
FIG. 21 is a diagram illustrating one example of the display device.
Figure 22:
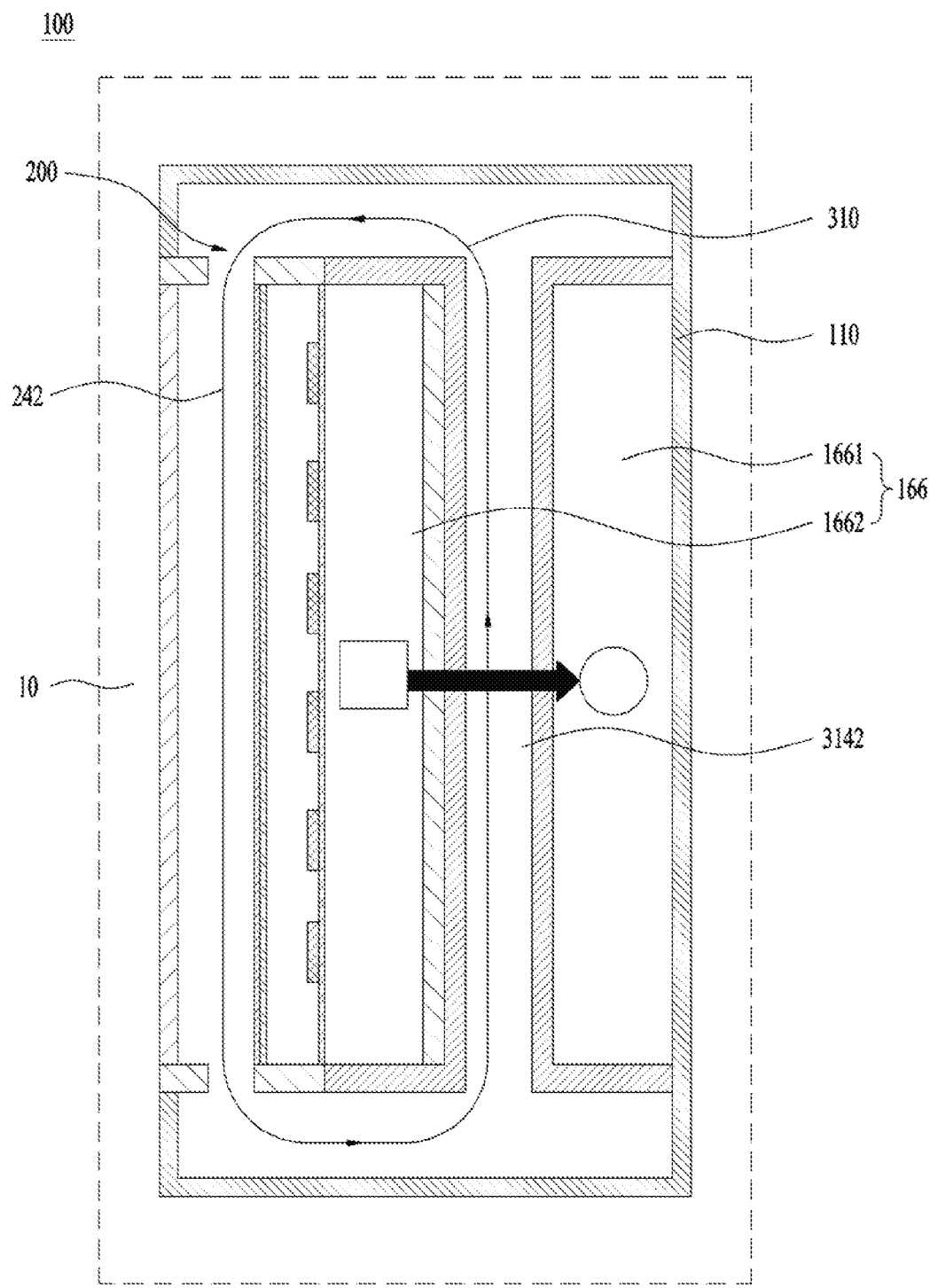
FIG. 22 is a diagram illustrating one example of the display device.

FIGS. 21 and 22 illustrate one example of the display device 100.

FIGS. 21 and 22 illustrates the plurality of the heat radiation portions connected to the rear surface of the display module 200 and the rear surface of the display device 100, like the embodiments shown in FIGS. 19 and 20. However, the front surface of the display module 200 may be coupled to the front surface of the display device 100 and is may function as the front surface of the display device 100, different from the embodiment of FIGS. 19 and 20.

The outer case 110 may include a sixth open hole 166. The sixth open hole 166 may be partitioned off from the internal space 150 and located in the external space 10.

FIG. 21 illustrates that the second heat radiation portion 1642 of the display device 100 is formed in a rear portion of the display module 200 and FIG. 22 illustrates the second heat radiation portion 1642 is formed in the display module 200. Considering a process of fabricating a sealing surface for partitioning off the sixth hole 166 from the internal space 150 of the display device 100, the embodiment of FIG. 21 is more preferred which illustrates the sixth open hole 166 is provided an outer surface of the display module 200.

Figure 23:
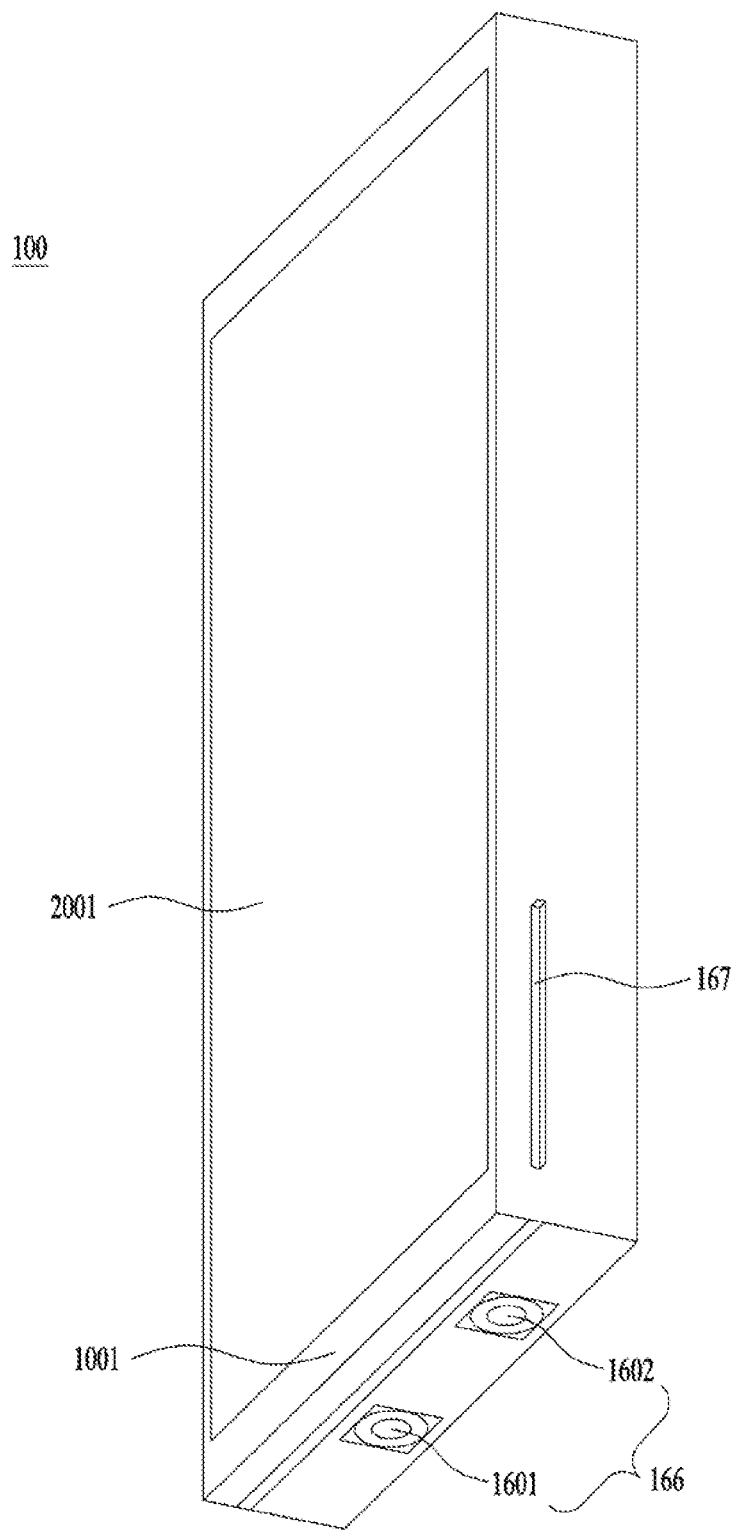
FIG. 23 is a diagram illustrating a specific embodiment of the display device shown in FIG. 21.
Figure 24:
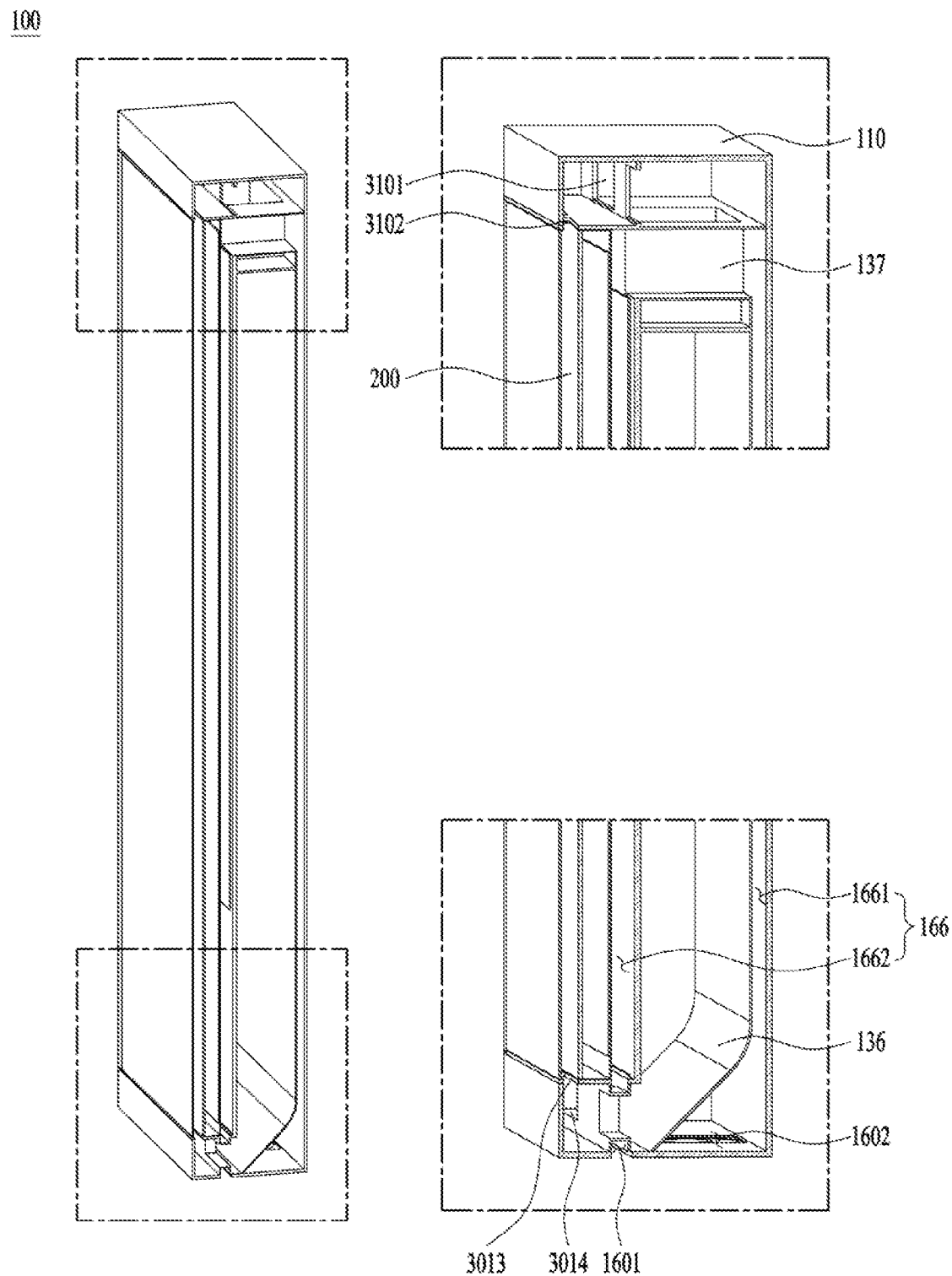
FIG. 24 is a longitudinal sectional diagram illustrating the display device shown in FIG. 23.

FIG. 23 is a diagram illustrating a specific embodiment of the display device shown in FIG. 21 and FIG. 24 is a longitudinal sectional diagram illustrating the display device 100 shown in FIG. 23.

For convenient description sake, FIGS. 23 and 24 are described together.

An inlet 1601 and an outlet 1602 of the sixth open hole 166 may be provided in the lower surface of the display device 100 of FIGS. 23 and 24. In addition, a seventh open hole 167 may be provided in another surface of the display device 100.

To maximize the heat radiation efficiency, a first heat radiation portion 1641 of the sixth open hole 166 is provided in the rear surface of the display device 100 and a second heat radiation portion 1642 may be provided in the rear surface of the display module 200.

Especially, the second heat radiation portion 1642 is provided to correspond to the entire rear surface of the display module 200 so that sufficient heat transmission can be performed.

As mentioned above, the seventh open hole 167 may be further provided in the second heat radiation portion 1642. The seventh open hole 167 allows air to be drawn from a hole of a left lateral surface and another hole of a right lateral surface of the display device 100, so that sufficient air flow can be formed.

The direction of air circulation may be reversed according to the rotational direction of the fan so that the inlet 1601 and the outlet 1602 of the open hole may be reversed. The inlet 1601 and the outlet 1602 may not always be fixed and specified.

To secure a sufficient space of the first closed passage 310, an adjustment bracket 136 with some inclination may be provided. The adjustment bracket 136 allows air to flow to the outlet 1602 naturally after passing through the first heat radiation portion 1641, without turbulent flow generation.

A connecting portion 137 may be provided between two heat radiation portions spaced apart from each other. The connecting portion 137 is provided to connect a ⊏-shaped outer passage as one continuous passage.

Figure 25:
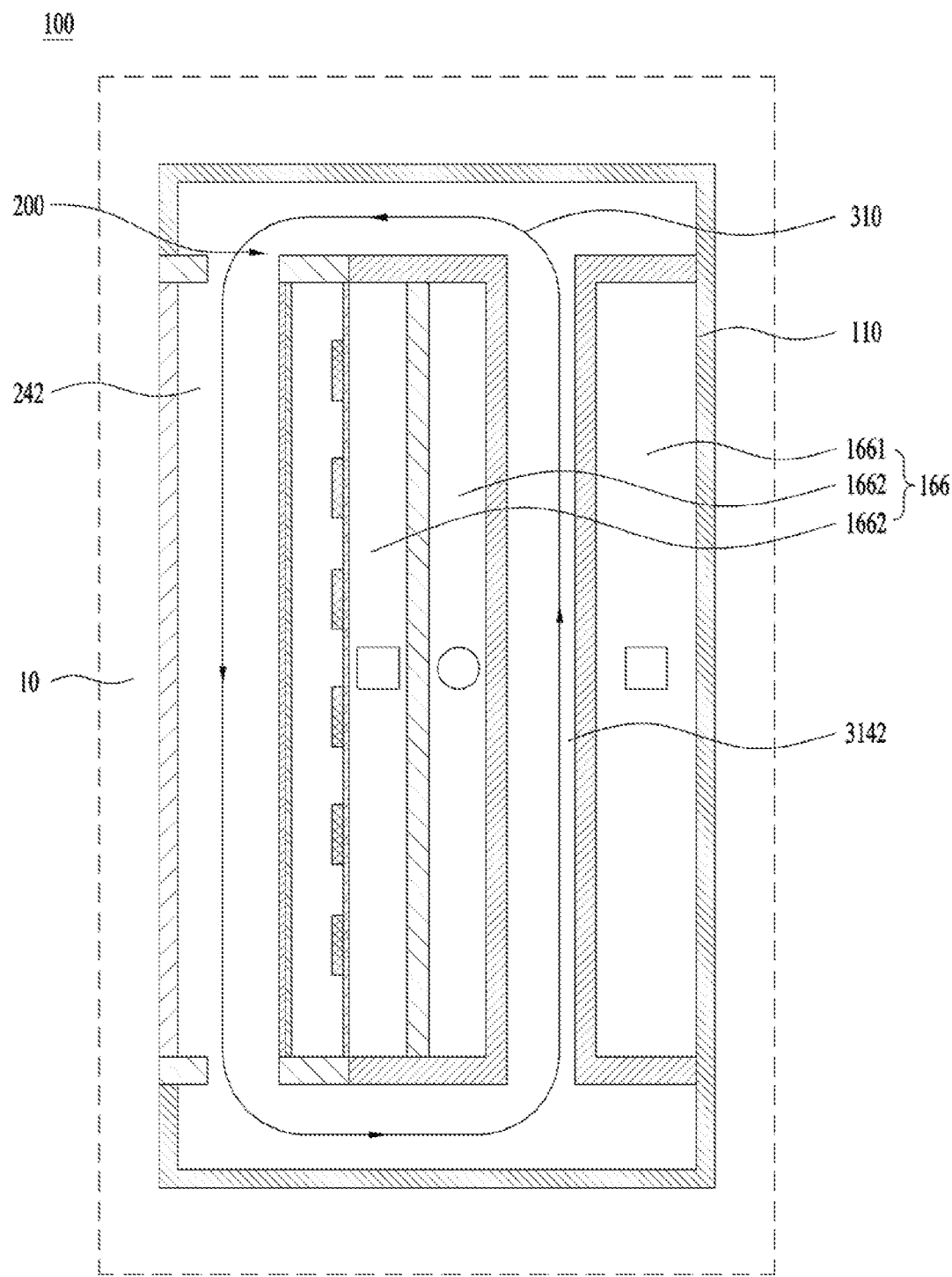
FIG. 25 is a sectional conceptual diagram illustrating the display device in accordance with the present disclosure.

FIG. 25 is a sectional conceptual diagram illustrating the display device 100 in accordance with the present disclosure.

Compared with the embodiment of FIG. 20, this embodiment of FIG. 25 as a characteristic that the front surface of the display module 200 and the front surface of the display device 100 are coupled to each other to form no space 3141. Compared with the embodiment of FIG. 21, the present embodiment includes three heat radiation portions.

Other basic characteristics of this embodiment may be equal to the other embodiments.

The sixth open hole 166 of this embodiment is divided into a first heat radiation portion 1641 through a third heat radiation portion. As the first through third heat radiation portions 1641 are connectedly provided as one path, the inlet 1601 and the outlet 1602 of the sixth open hole 166 may be provided in a back surface of the display device.

Such characteristics may prevent the lowered heat radiation efficiency which might occur when the high temperature air is re-drawn into the inlet 1601 after exhausted via the outlet 1602 of the sixth open hole 166.

As the present features may be embodied in several forms without departing from the characteristics thereof, it should also be understood that the above-described embodiments are not limited by any of the details of the foregoing description, unless otherwise specified, but rather should be considered broadly within its scope as defined in the appended claims, and therefore all changes and modifications that fall within the metes and bounds of the claims, or equivalents of such metes and bounds, are therefore intended to be embraced by the appended claims.

What is claimed is:

1. A display device comprising:
a light source unit;
an optical sheet spaced a preset distance apart from a front of the light unit;
a display panel spaced a preset distance apart from a front surface of the optical sheet;
a module case configured to form at least one of a first space between the display panel and the optical sheet, a second space between the optical sheet and the light source unit and a third space having a rear surface of the light source unit exposed thereto;
a through-hole formed in the module case and at least one of the first space, the second space and the third spaces; and
an outer case configured to form an internal space partitioned off from an external space and a first closed passage located in the internal space by the module case mounted in the outer case,
wherein a first passage is located in the first closed passage.

2. The display device of claim 1, wherein the first passage is formed in one of the first, second and third spaces.

3. The display device of claim 1, wherein the first passage is formed throughout the first space and the second space.

4. The display device of claim 1, further comprising:
an inner case configured to form a second closed passage partitioned off from the first closed passage and surrounded by the first closed passage with respect to one cross section.

5. The display device of claim 4, wherein the outer case comprises a first open hole partitioned off from the internal space and located in the external space, and
the first open hole is provided between the first closed passage and the second closed passage.

6. The display device of claim 1, further comprising:
a partition bracket configured to form a second closed passage partitioned off from the first closed passage and configured to directly exchange heat with the external space.

7. The display device of claim 6, wherein the internal space is partitioned off into a front surface space including the display module and a rear surface space partitioned off from the front surface space, and
the first closed passage is provided in the front surface space and the second closed passage is provided in the rear surface space.

8. The display device of claim 6, wherein the outer case comprises a second open hole partitioned off from the internal space and located in the external space, and
the second open hole is surrounded by the second closed passage.

9. The display device of claim 1, wherein the module case comprises a third open hole partitioned off from the internal space and located in the external space, and
the third open hole passes through the third space.

10. The display device of claim 9, wherein the outer case comprises a fourth hole partitioned off from the internal space and located in the external space, and
one region of the fourth open hole is in contact with the third open hole and the other region is in contact with the first closed passage.

11. The display device of claim 1, wherein the outer case comprises a fifth open hole partitioned off from the internal space and located in the external space, and
an inlet and an outlet of the fifth open hole are formed in one surface of the outer case, and
wherein the display device further comprises a division bracket configured to distinguish the inlet and the outlet of the fifth open hole from each other.

12. The display device of claim 1, wherein the outer case comprises a sixth open hole partitioned off from the internal space and located in the external space, and
the sixth open hole comprises,
a first heat radiation portion provided in a rear surface of the outer case;
a second heat radiation portion spaced a preset distance apart from the first heat radiation portion; and
a connecting portion connecting the first and second heat radiation portions with each other in one region.

13. The display device of claim 1, wherein a front surface of the display panel is coupled to a front surface of the outer case.

* * * * *